United States Patent
Khoury et al.

(10) Patent No.: US 7,965,214 B2
(45) Date of Patent: *Jun. 21, 2011

(54) SYSTEM AND METHOD OF CHANGING A PWM POWER SPECTRUM

(75) Inventors: John M. Khoury, Austin, TX (US); Richard Gale Beale, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/848,020

(22) Filed: Jul. 30, 2010

(65) Prior Publication Data

US 2010/0296671 A1 Nov. 25, 2010

Related U.S. Application Data

(63) Continuation of application No. 12/198,457, filed on Aug. 26, 2008, now Pat. No. 7,791,521, and a continuation-in-part of application No. 12/126,125, filed on May 23, 2008, now Pat. No. 7,598,895.

(60) Provisional application No. 61/072,563, filed on Apr. 1, 2008.

(51) Int. Cl.
*H03M 1/82* (2006.01)

(52) U.S. Cl. ...... 341/152; 375/238; 381/104; 455/127.3

(58) Field of Classification Search .................. 341/152; 375/238; 381/104; 455/127.3
See application file for complete search history.

(56) References Cited

U.S. PATENT DOCUMENTS

| | | | |
|---|---|---|---|
| 5,014,016 A | 5/1991 | Anderson |
| 5,247,581 A | 9/1993 | Gurcan |
| 5,389,829 A | 2/1995 | Milazzo |
| 5,672,998 A | 9/1997 | Wittlinger |
| 5,798,672 A | 8/1998 | Masini et al. |
| 6,097,249 A | 8/2000 | Strickland et al. |
| 6,127,885 A | 10/2000 | Colangelo |
| 6,160,455 A | 12/2000 | French et al. |
| 6,297,692 B1 | 10/2001 | Nielsen |
| 6,552,606 B1 | 4/2003 | Veltman et al. |
| 6,552,607 B1 | 4/2003 | Danielson |
| 6,563,377 B2 | 5/2003 | Butler |
| 6,594,309 B1 | 7/2003 | Botti et al. |
| 6,597,240 B1 | 7/2003 | Walburger et al. |
| 6,653,897 B2 | 11/2003 | Sawashi |
| 6,794,932 B1 | 9/2004 | Butler |
| 6,847,257 B2 | 1/2005 | Edwards et al. |
| 7,046,080 B2 | 5/2006 | Watts et al. |

(Continued)

FOREIGN PATENT DOCUMENTS

WO 2006053371 5/2006

*Primary Examiner* — Jean B Jeanglaude
(74) *Attorney, Agent, or Firm* — Polansky & Associates, P.L.L.C.; R. Michael Reed

(57) ABSTRACT

In a particular embodiment, a circuit device includes a pulse edge control circuit to receive at least one pulse-width modulated (PWM) signal from a PWM source. The pulse edge control circuit is adapted to selectively apply a phase shift operation to the at least one PWM signal at integer submultiples of a frame repetition rate to produce at least one modulated PWM signal having a changed power spectrum. The pulse edge control circuit provides the at least one modulated PWM signal to at least one output of the pulse edge control circuit.

26 Claims, 19 Drawing Sheets

U.S. PATENT DOCUMENTS

| | | |
|---|---|---|
| 7,068,095 B2 | 6/2006 | Bernardon |
| 7,078,964 B2 | 7/2006 | Risbo et al. |
| 7,119,629 B2 | 10/2006 | Nielsen et al. |
| 7,142,049 B2 | 11/2006 | Kirn |
| 7,142,050 B2 | 11/2006 | Risbo |
| 7,190,224 B2 | 3/2007 | Sutardja |
| 7,218,173 B2 | 5/2007 | Nalbant |
| 7,230,485 B2 | 6/2007 | De Cremoux et al. |
| 7,262,658 B2 | 8/2007 | Ramaswamy et al. |
| 7,279,965 B2 | 10/2007 | Hansen et al. |
| 7,298,209 B1 | 11/2007 | Sutardja |
| 7,301,417 B2 | 11/2007 | Shinohara |
| 7,332,962 B2 | 2/2008 | Wu et al. |
| 7,242,248 B1 | 9/2008 | Sutardja |
| 7,598,895 B1 | 10/2009 | Khoury |
| 7,701,307 B2 | 4/2010 | Beale |
| 7,724,105 B2 | 5/2010 | Alderson |
| 2003/0020539 A1 | 1/2003 | Sawashi |
| 2003/0067348 A1 | 4/2003 | Butler |
| 2003/0122615 A1 | 7/2003 | Zeff |
| 2004/0169552 A1 | 9/2004 | Butler |
| 2004/0232978 A1 | 11/2004 | Easson et al. |
| 2004/0232979 A1 | 11/2004 | Edwards et al. |
| 2005/0054307 A1 | 3/2005 | Watts et al. |
| 2005/0083114 A1 | 4/2005 | Risbo |
| 2005/0083115 A1 | 4/2005 | Risbo |
| 2005/0083116 A1 | 4/2005 | Risbo et al. |
| 2005/0099231 A1 | 5/2005 | Sutardja |
| 2005/0116770 A1 | 6/2005 | Kirn |
| 2005/0200404 A1 | 9/2005 | Bernardon |
| 2006/0008095 A1 | 1/2006 | Tsuji |
| 2006/0077007 A1 | 4/2006 | De Cremoux et al. |
| 2006/0093064 A1* | 5/2006 | Cui ............................... 375/297 |
| 2006/0103458 A1 | 5/2006 | Hansen et al. |
| 2006/0158359 A1* | 7/2006 | Magrath ........................ 341/143 |
| 2006/0226904 A1 | 10/2006 | Nalbant |
| 2006/0279354 A1 | 12/2006 | Hansen et al. |
| 2007/0002943 A1 | 1/2007 | Midya |
| 2007/0024365 A1 | 2/2007 | Ramaswamy et al. |
| 2007/0146069 A1 | 6/2007 | Wu et al. |
| 2007/0229159 A1 | 10/2007 | Krishnan et al. |
| 2008/0042743 A1 | 2/2008 | Wong et al. |
| 2009/0190650 A1 | 7/2009 | Huang et al. |
| 2009/0243744 A1 | 10/2009 | Beale et al. |
| 2009/0243745 A1 | 10/2009 | Alderson et al. |
| 2009/0243903 A1 | 10/2009 | Khoury |

* cited by examiner

SYSTEM AND METHOD OF CHANGING A PWM POWER SPECTRUM

CROSS-REFERENCE TO RELATED APPLICATION

The present application is a continuation application of U.S. patent application Ser. No. 12/198,457 filed on Aug. 26, 2008 and entitled "SYSTEM AND METHOD OF CHANGING A PWM POWER SPECTRUM," now U.S. Pat. No. 7,791,521, which is a non-provisional patent application of and which claimed priority from U.S. provisional patent application Ser. No. 61/072,563, filed Apr. 1, 2008 and entitled "COMMON MODE CARRIER SUPPRESSION AND SPECTRAL SHAPING IN CLASS D AMPLIFIERS," the contents of which applications are hereby incorporated by reference in their entireties. Further, the U.S. patent application Ser. No. 12/198,457, from which the present application claims priority, is a continuation-in-part of and claims priority to U.S. patent application Ser. No. 12/126,125, filed on May 23, 2008 and entitled "SYSTEM AND METHOD OF ALTERING A PWM CARRIER POWER SPECTRUM, now U.S. Pat. No. 7,598,895, the content of which is hereby also incorporated by reference in its entirety.

FIELD OF THE DISCLOSURE

The present disclosure is generally related to a system and method of changing a pulse-width modulated (PWM) power spectrum. More particularly, the present disclosure is generally related to modulating a PWM signal to produce a modulated PWM signal having at least one of a suppressed carrier and an altered PWM power spectrum.

BACKGROUND

In general, class D audio amplifiers have the benefit of high power efficiency. However, such amplifiers also have a major drawback in terms of electromagnetic interference (EMI), which can interfere with nearby wireless receivers, violate FCC emission limits, introduce noise into various signal paths, or any combination thereof. In a particular example related to audio applications, switching frequencies can range from approximately 200 kHz to 1000 kHz. In class D amplifiers, the resulting carrier and its harmonics due to such switching often overlap with the amplitude modulated (AM) frequency band, which ranges from approximately 520 kHz to 1710 kHz. Thus, the class D amplifier may cause EMI that can interfere with nearby AM receivers unless some "mitigation" techniques are used. Class D amplifiers can also be used in connection with switched power supplies, direct-current-to-direct-current (DC-DC) converters, data converters, motor controllers, other systems that use pulse-width modulation, or any combination thereof. In each such instance, the class D amplifiers can generate electromagnetic interference (EMI) and can interfere with AM frequency bands and other sensitive frequency bands.

In general, class D amplifiers can use a variety of modulation techniques. One common modulation technique is referred to as BD double-sided (BD-D) pulse-width modulation (PWM). In general, BD-D PWM includes varying the pulse width of two complementary pulse waves where the centers of the pulses are time-aligned and often centered within a pulse width modulated (PWM) frame. For positive input signals, a pulse width of the input signal (typically referred to as P or B) that drives the high side of a bridged output is increased, while a complementary pulse width of the signal that drives the low side (typically referred to as N or D) of the bridged output is reduced. Unfortunately, such BD modulation results in the common mode carrier energy being centered inconveniently at the frame rate. In a particular example where the switching frequencies for audio applications overlap with the AM band, the common mode carrier and its harmonics can radiate energy in the AM frequency band, interfering with reception of an AM radio in close proximity or within the same system.

One technique employed in the prior art for mitigating AM radio interference includes adjusting the frequency of the PWM carrier signal away from the desired radio station frequency. While such adjustments may avoid interfering with a co-resident AM radio, it is not practical for avoiding interference with a non co-resident AM radio (since the desired radio frequency may not be known) and does not help suppress EMI for emission compliance. Further, a technique employed in the prior art for suppressing EMI for emission compliance includes dithering the frequency of the PWM carrier signal. However, the dithering technique provides modest average EMI suppression, sometimes has minimal suppression of instantaneous peak carrier interference, and can adversely impact the integrity of the baseband signal and limit a maximum modulation index of the signal. Therefore, it is desirable to meaningfully suppress the PWM carrier signal power with little or no compromise in the baseband signal performance.

SUMMARY

In a particular embodiment, a circuit device includes a pulse edge control circuit to receive at least one pulse-width modulated (PWM) signal from a PWM source. The pulse edge control circuit is adapted to selectively apply a phase shift operation to the at least one PWM signal at integer submultiples of a frame repetition rate to produce at least one modulated PWM signal having a changed power spectrum. The pulse edge control circuit provides the at least one modulated PWM signal to at least one output of the pulse edge control circuit.

In another particular embodiment, a circuit device includes a pulse edge control circuit to receive PWM signals via at least two inputs. The pulse edge control circuit is adapted to selectively apply a phase shift operation to the received PWM signals at integer submultiples of a frame repetition rate to produce modulated PWM signals having suppressed carriers. The pulse edge control circuit provides the modulated PWM signals to respective outputs of the pulse edge control circuit.

In still another particular embodiment, a method is disclosed that includes receiving at least one pulse-width modulated (PWM) signal at a pulse edge control circuit. The method further includes selectively applying a phase shift operation to the at least one PWM signal at integer submultiples of a frame repetition rate to produce at least one modulated PWM signal having a changed power spectrum and includes providing the at least one modulated PWM signal to a corresponding at least one output.

DETAILED DESCRIPTION OF ILLUSTRATIVE EMBODIMENTS

In general, systems and methods are disclosed that are adapted to apply a phase shift operation to selectively shift pulse-width modulated (PWM) signals by plus or minus a quarter of a frame width (i.e., ±T/4, where the variable T represents the frame width) to produce a modulated PMW output signal having an altered power spectrum, a suppressed carrier, or any combination thereof. In a particular embodiment, the systems and methods produce the modulated PWM output signal without altering a carrier frequency, without altering a frame repetition rate, or any combination thereof. The system and method can be applied either to single-ended PWM signals, multiple PWM signals, or complementary PWM signals. As used herein, the term "complementary" with respect to PWM pulses refers to two signals that aggregate to approximately (nominally) 100% of a duty cycle of a PWM frame (a carrier period) within limits of time quantization effects.

Further, the phase shifts can be applied to selectively shift the PWM signals symmetrically within a frame, asymmetrically within the frame, or symmetrically with a wrap-around within the frame. In general, the term "wrap-around" refers to a process of wrapping a portion of a PWM pulse that crosses a PWM frame boundary to an opposing boundary of the same PWM frame.

Additionally, the particular phase shifting operation can be applied periodically or variably (randomly) or according to a constructed pattern. Periodic application of the phase shifting operation can suppress a carrier and move carrier energy away from the carrier frequency within the modulated PWM output signal. Random application of the phase shifting operation can spread and whiten the power spectrum of the modulated PWM output signal.

Figure 1:
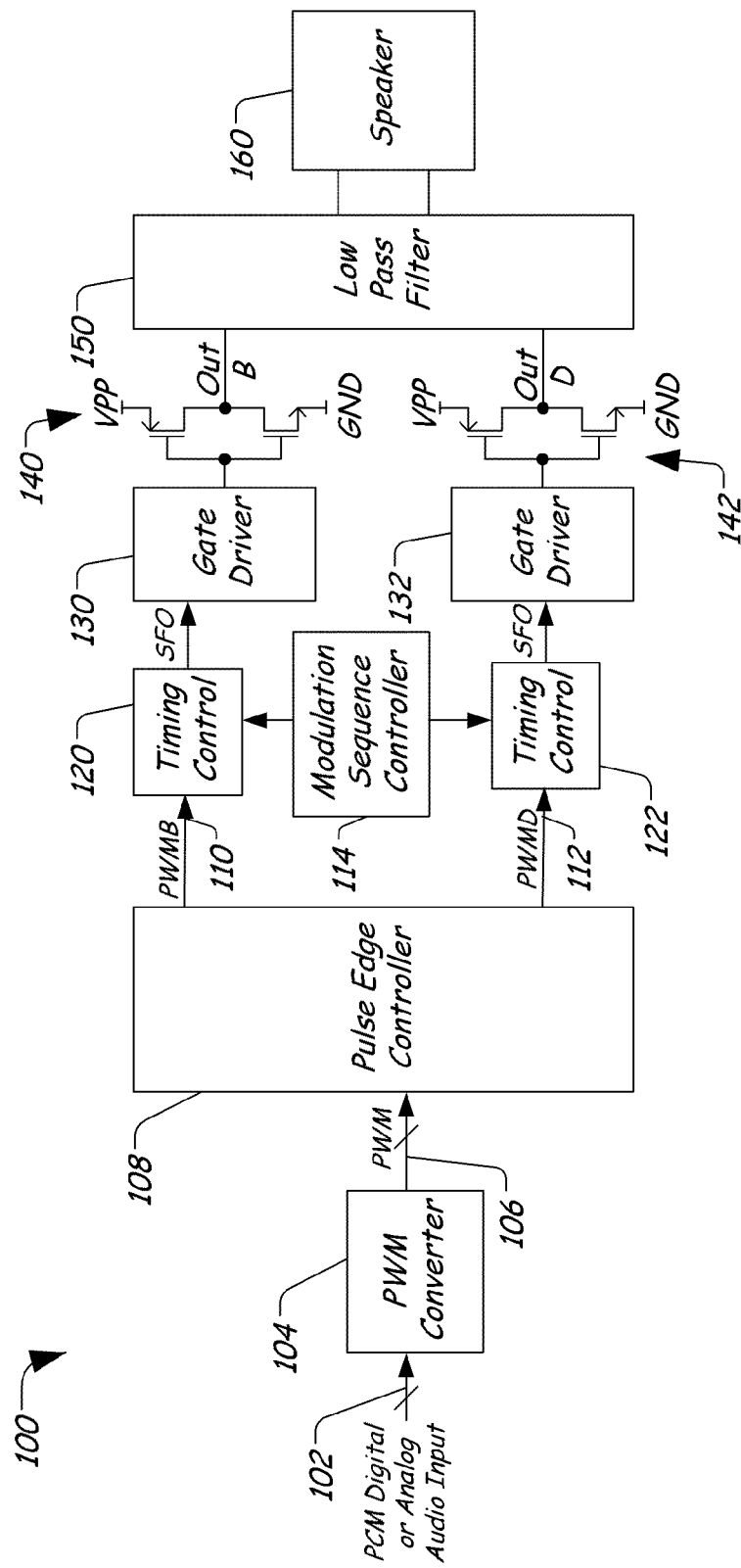
FIG. 1 is a block diagram of a first particular illustrative embodiment of a system to suppress a pulse-width modulation (PWM) carrier.

FIG. 1 is a block diagram of a particular illustrative embodiment of a system 100 to suppress a pulse-width modulation (PWM) carrier. The system 100 includes an input 102 to receive a pulse-code-modulated (PCM) digital or analog input signal, such as an audio signal. The input 102 is coupled to a pulse-width modulated (PWM) converter 104, which converts the input signal into a PWM word 106 and which provides the PWM word 106 to a pulse edge controller 108. The pulse edge controller 108 outputs a PWM (PWMB) signal 110 and a PWM (PWMD) signal 112 to first and second timing control blocks 120 and 122, respectively. In a particular embodiment, the PWMB and PWMD signals 110 and 112 can be a complementary PWM signal pair. In a particular example, the PWMD signal 112 may be a duty cycle complement of the PWMB signal 110, such that the two signals 110 and 112 aggregate to nominally one hundred percent (100%) of the duty cycle of the PWM frame within quantization limits. The first timing control block 120 receives the PWMB signal 110 and drives one or more gate drivers 130 for output transistors 140 coupled between a supply voltage (VPP) and ground (GND) to provide a high side output signal (OUTB).

The second timing control block 122 receives the PWMD signal 112 and drives one or more gate drivers 132 for output transistors 142 coupled between a supply voltage (VPP) and ground (GND) to provide a low side output signal (OUTD). While the output transistors 140 and 142 are shown as simple complementary metal-oxide semiconductor (CMOS) inverters, in other particular embodiments, more complex output circuit topologies can be used.

The high side (OUTB) and low side (OUTD) signals from the output transistors 140 and 142 are provided to a speaker 160 through a demodulation low pass filter (LPF) 150. Additionally, the system 100 includes a modulation sequence controller 114 that is coupled to the first and second timing control blocks 120 and 122 to selectively apply one or more modulation sequences to the PWMB and PWMD signals 110 and 112 to modulate the PWMB and PWMD signals 110 and 112 to produce a modulated PWM output with a suppressed carrier.

In a particular embodiment, the first and second timing control blocks 120 and 122 in conjunction with the pulse edge controller 108 can be adapted to suppress a carrier power and associated harmonics of the received PWM signal 106 without altering its carrier frequency, its frame repetition rate, or any combination thereof. In a particular embodiment, a PWM output signal can have a suppressed carrier power, a whitened power spectrum, a power spectrum with carrier energy concentrated at frequencies other than the carrier frequency, or any combination thereof.

In general, the pulse edge controller 108 and the first and second timing control blocks 120 and 122 are adapted to selectively apply a phase shift operation to selectively shift the PWM signal 106 early or late, for example, by plus or minus a quarter of the frame width (i.e., ±T/4) at intervals representing integer multiples of the PWM frame width to suppress a carrier energy and its harmonics at the frame repetition rate. In general, the timing control blocks can be either analog or digital implementations located either before or after the pulse edge controller. In general, the phrase "integer sub-multiples of the frame repetition rate" refers to a frequency with a period corresponding to an integer multiple of the PWM frame width. For example, the phase shift operation can be selectively applied at every frame, every other frame, or every n-th frame (where n is a positive integer).

In a particular embodiment, the carrier energy of the modulated PWM output signals is suppressed without altering the frame repetition rate, which is the rate at which PWM frames repeat. Further, the pulse edge controller 108 and the first and second timing control blocks 120 and 122 can perform the phase shift operation using any number of phase sift operations, including quarter frame-centered symmetrical pulse shifting, quarter frame-centered asymmetrical pulse shifting with no wrap-around, or quarter frame-centered symmetrical pulse shifting with wrap-around.

Figure 2:
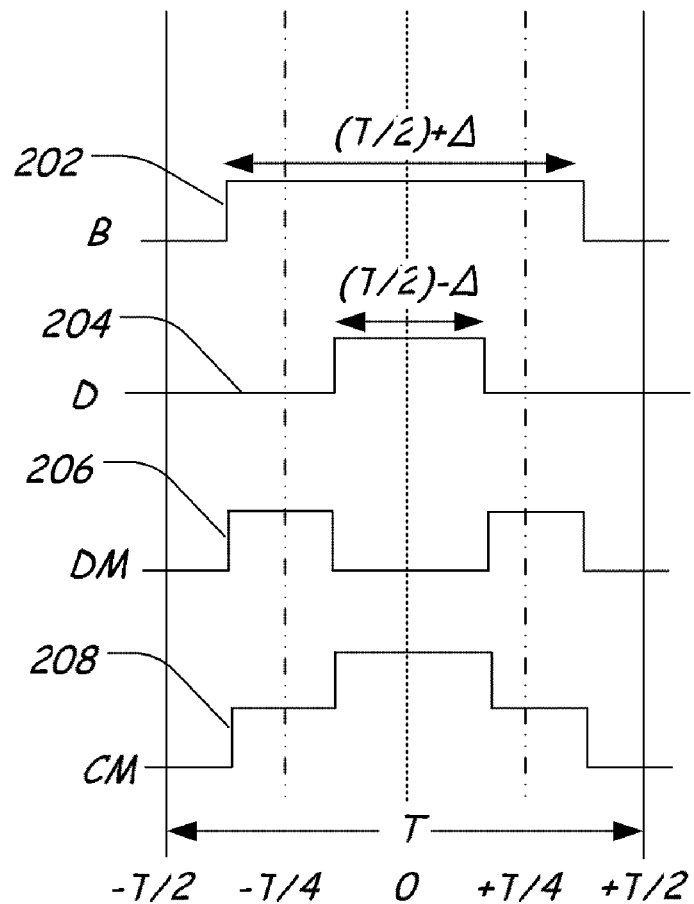
FIG. 2 is a graph of a particular representative embodiment of a conventional BD-D PWM signal where pulse widths of two pulse waves are varied, which pulse waves are time-aligned and often centered within a pulse width modulated (PWM) frame.

FIG. 2 is a graph of a particular representative embodiment of a conventional BD-D PWM signal 200 where pulse widths of two pulse waves are varied, which pulse waves are time-aligned and often centered within a pulse width modulated (PWM) frame. In general, BD-D PWM is used with many class D amplifiers at an output that drives an H-bridge, for example. The PWM frame has a time (T) and the pulse widths of the two signals (B and D) 202 and 204 are nominally centered within the PWM frame (at approximately T/2). For positive input signals, the pulse width of the signal that drives the high side of the bridged output (the "B" signal 202) is increased by delta ($\Delta$) while the pulse width of the signal that drives the low side of the bridged output (the "D" signal 204) is decreased by delta ($\Delta$).

In general, the result is a differential signal 206 across the load (i.e. a filter in cascade with a speaker) consisting of two positive pulses nominally centered at +/−T/4, where T is the width of the PWM frame and where the reference time position T=0 represents the center of the frame. In general, the carrier frequency of the differential signal 206 is at twice the PWM frame rate.

Conversely, for negative input signals, the low side pulse width (the D signal 204) increases while the high side pulse width (the B signal 202) decreases resulting in two similar but negative differential mode pulses. Differentially, this is an efficient arrangement since there is no wasted differential energy. However, a strong common mode component 208 is created at the PWM frame rate, independent of whether the input is positive or negative.

Figure 3:
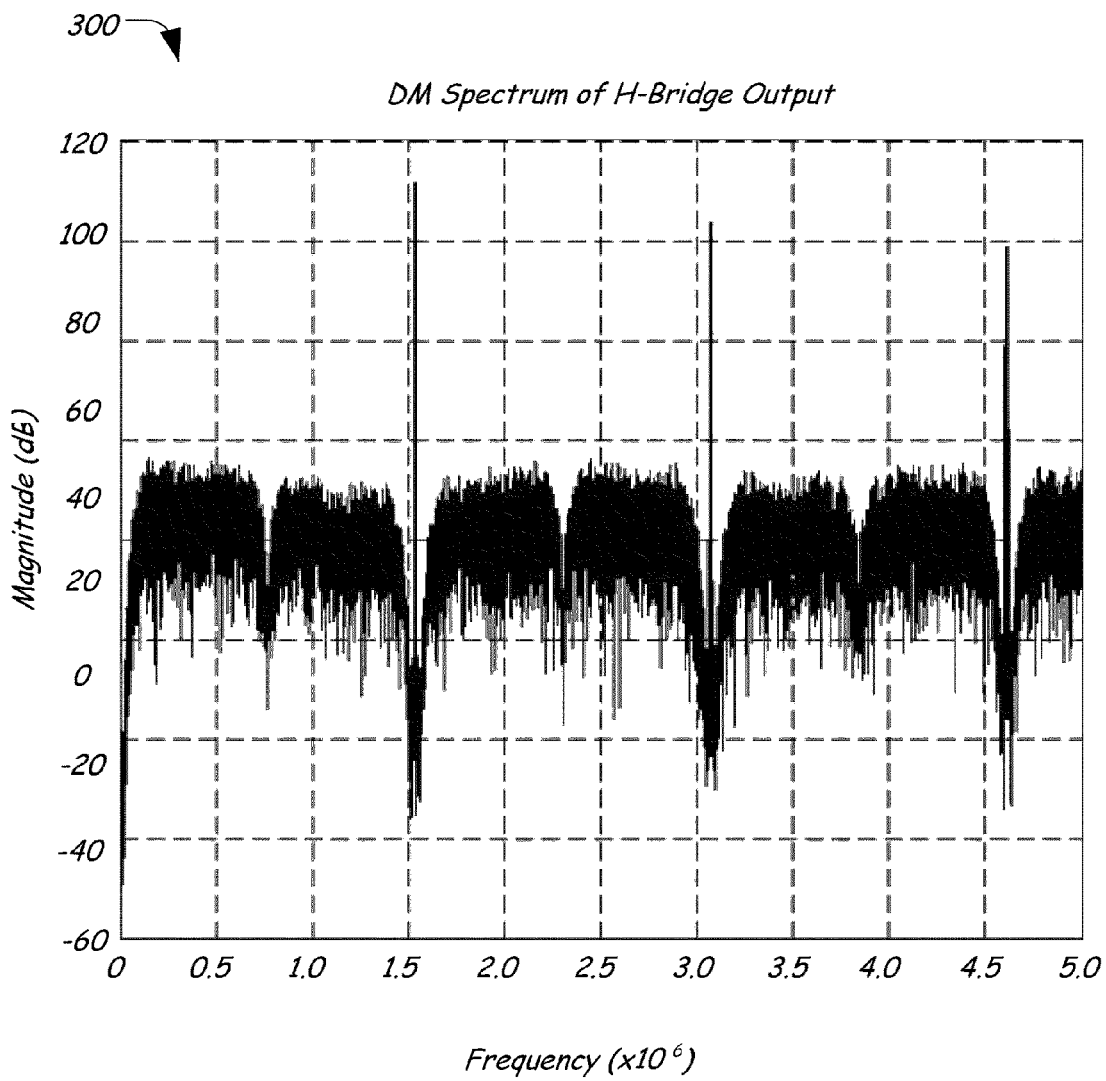
FIG. 3 is a graph of a differential mode (DM) power spectrum of an output signal using the BD-D PWM signal illustrated in FIG. 2 and using a 768 kHz frame rate.

FIG. 3 is a graph of a differential mode (DM) power spectrum 300 of an output signal using the BD-D PWM signal illustrated in FIG. 2 and using a 768 kHz frame rate. In particular, in the spectrum 300, the carrier frequency of the differential mode signal 206 (illustrated in FIG. 2) is at twice the frame rate of 768 kHz.

Figure 4:
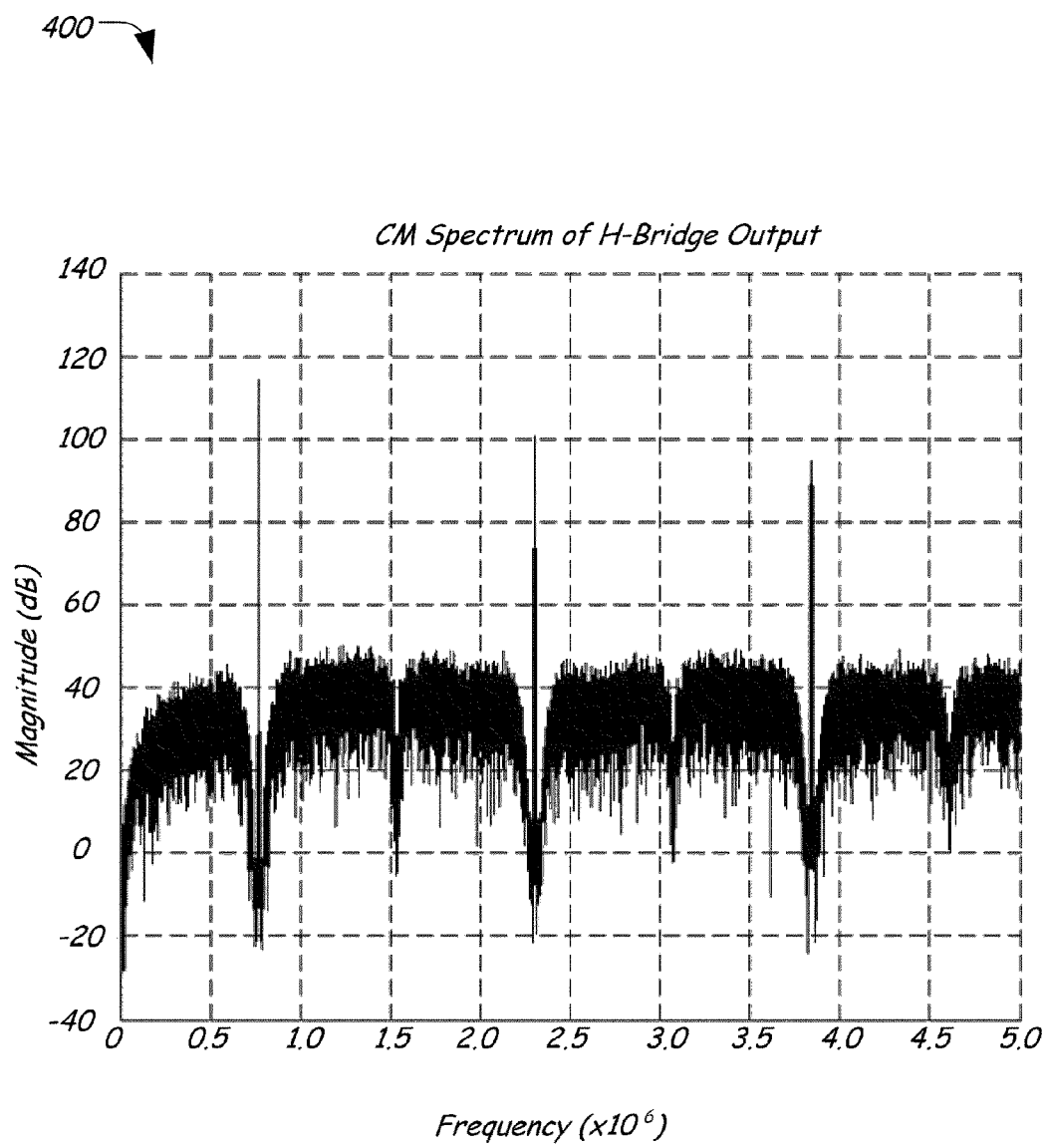
FIG. 4 is a graph of a common mode (CM) power spectrum of an output signal using the BD-D PWM signal illustrated in FIG. 2 and using a 768 kHz frame rate.

FIG. 4 is a graph of a common mode (CM) power spectrum 400 of an output signal using the BD-D PWM signal illustrated in FIG. 2 and using a 768 kHz frame rate. Unfortunately, the B and D signals within the pulse-width modulated (PWM) frame (such as the B and D signals 202 and 204 illustrated in FIG. 2) introduce a strong common mode component illustrated by the common mode spectrum 400 that is indicated by the peak common mode power levels at the carrier frequency and at odd harmonics of the carrier frequency, which peak power levels can generate electromagnetic interference (EMI) and amplitude modulated (AM) radio interference in nearby receiver circuitry. Further, the common mode carrier frequency is centered inconveniently at the frame rate. Given that practical switching frequencies for audio applications range from 200 kHz to 1000 kHz and the AM band ranges from 520 kHz to 1710 kHz, there is a problem with radiated energy of the common mode carrier and its harmonics interfering with reception of an AM radio signal in close proximity or in the same system. Therefore, it is desirable to suppress the common mode carrier of a BD-D PWM signal with little or no compromise in the differential mode performance.

The system 100 described above with respect to FIG. 1 is adapted to selectively apply a phase shift operation to alter an output power spectrum and to suppress carrier energy in the output signal, reducing or eliminating electromagnetic interference (EMI) and amplitude modulation (AM) radio frequency interference. In general, the phase shift operation can be any of a number of phase shift operations, including those described below.

In general, this discussion assumes that the input PWM pulses are nominally centered within a PWM frame and that the output PWM pulse centers are shifted symmetrically relative to this center frame reference location in equal magnitude and opposite directions (±T/4). However, it should be understood that use of the frame center as the reference point and the relative phase shift magnitudes of ±T/4 are intended for discussion purposes only, and is not intended to be limiting. Other temporal reference points and relative phase shift magnitudes could also be used. For example, the reference location could be either T/2 or alternatively T/4, and the phase shift magnitudes could be either zero (0) and T/2 or alternatively +T/4 and −T/4. The net effect is that from frame to frame the output pulse phase is shifted by 0 or T/2 with respect to the previous output frame.

In a particular example, the input PWM data signals (B and D), such as the PWM signals 110 and 112 illustrated in FIG. 1, are shifted by T/2 periodically every n-th frame, where the variable "n" is a positive integer and where "T" represents a frame interval or frame width to produce modulated outputs PWMB and PWMD at the inputs to the gate drivers 130 and 132, respectively. In practice, the variable "n" is limited to positive integer values, avoiding creation of practical problems, such as undesired noise. A basic Fourier Transform analysis shows that the common mode carrier power at the frame rate ($F_C$) and its harmonic multiples are suppressed while sidebands are created at harmonic frequencies according to the following equation:

$$\text{sidebands} = i * F_C \pm \frac{F_C}{n}, \quad \text{(Equation 1)}$$

where "i" represents the i-th harmonic of the carrier. This particular periodic modulation sequence is helpful for locating common mode tones created by the amplifier at different frequencies to avoid interference in an AM radio frequency band or other sensitive frequencies. In a particular illustrative example, the phase shift can be applied alternately every second frame (n=2) and the sidebands will be created at $i*0.5*F_C$ and $i*1.5*F_C$.

1. Quarter Frame Symmetrical Pulse Shifting

Figure 5:
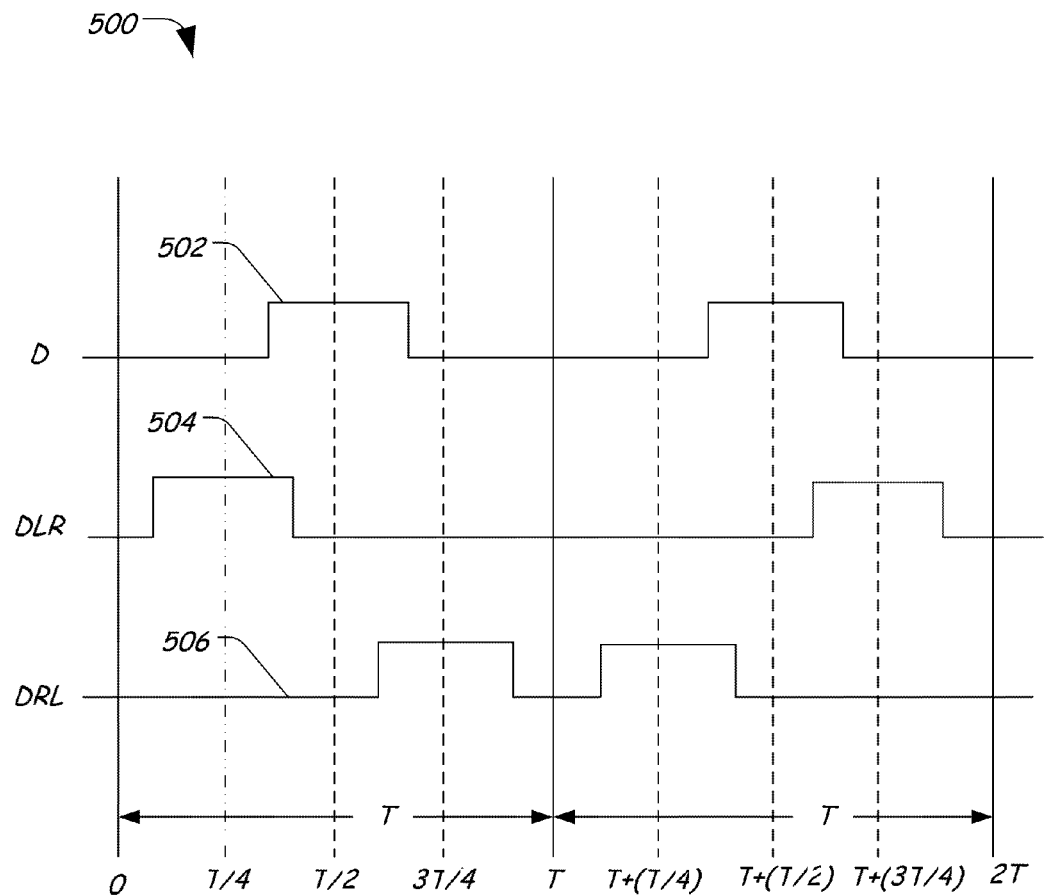
FIG. 5 is a graph of a particular illustrative embodiment of a timing diagram illustrating the basic concept for a quarter-frame phase shift of a single PWM signal to suppress a carrier at the frame rate.

FIG. 5 is a graph of a particular illustrative embodiment of a timing diagram 500 illustrating a quarter frame phase shift of a single pulse-width modulated (PWM) signal to suppress a carrier at the frame rate. The timing diagram 500 includes a PWMD signal 502 that is centered (positioned) within the frame at T/2. Over a two frame interval, the PWMD signal 502 is shifted. In one example, the PWMD signal 502 is shifted left (−T/4) then right (+T/4), as illustrated at 504. In another example, the PWMD signal 502 is shifted right (+T/4) then left (−T/4), as illustrated at 506.

In general, the pulse width of the PWMD signal 502 is less than half of the frame width (T/2), so shifting the PWMD signal 502 early or late does not introduce any frame edge boundary issues. In other words, shifting of the PWMD signal 502 does not cause any portion of the pulse to cross the frame boundary (such as the PWM frame boundaries at T=0, T, or 2T, illustrated in FIG. 5). However, when the pulse width is greater than T/2, then boundary problems can arise.

Figure 6:
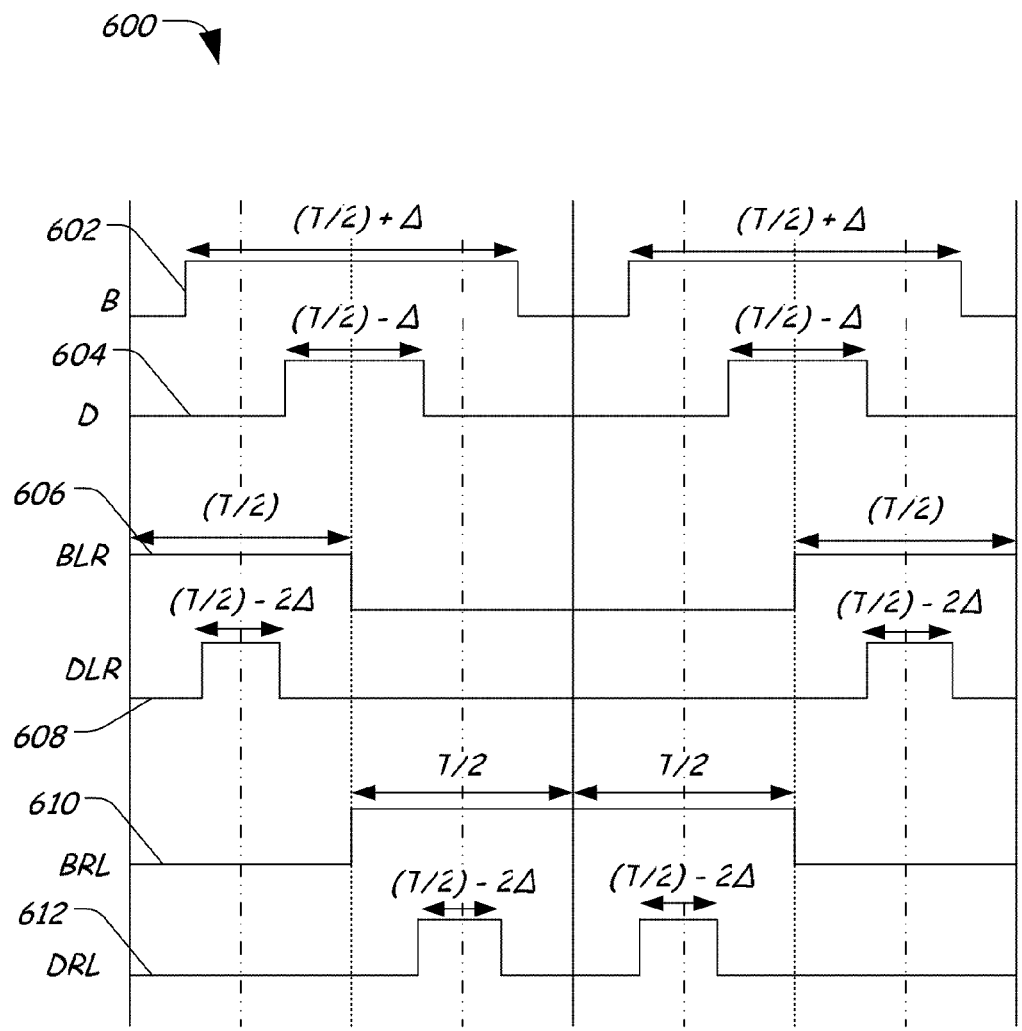
FIG. 6 is a graph of a particular illustrative embodiment of a timing diagram illustrating a quarter-frame phase shift with modulation redistribution of BD-D PWM signals to suppress a common mode carrier at the frame rate and limit maximum pulse width to T/2.

FIG. 6 is a graph of a particular illustrative embodiment of a timing diagram 600 illustrating a quarter-frame phase shift of PWM signals with modulation redistribution of BD-D PWM signals to suppress a carrier at the frame rate in which the maximum pulse width is limited to half of the frame width (T/2). The timing diagram 600 illustrates a high side PWM signal (B) 602 and a low-side PWM signal (D) 604 in sequential frames. The PWM signals (B and D) 602 and 604 are shifted left and then right as illustrated by PWM BLR 606 and PWM DLR 608. Further, the PWM signals (B and D) 602 and 604 are shifted right and then left as illustrated by PWM BLR 610 and PWM DLR 612.

In this particular example, the high side PWM signal (B) 602 has a width that is greater than half of the frame width (T). Specifically, the width of the high side PWM signal (B) 602 is approximately half of the frame width plus a delta (T/2+Δ). Further, the low-side PWM signal (D) 604 has a corresponding width that is less than half of the frame width (T), i.e., T/2−Δ. In a particular example, the high side PWM signal (B) 602 and the low side PWM signal (D) 604 are complementary signals, where a duty cycle of the combined PWM signals 602 and 604 is nominally equal to 100% of the frame width within the limits of time quantization effects. In this example, prior to shifting left or right, the width of the high side PWM signal (B) 602 is reduced by delta (Δ) and the width of the low side PWM signal (D) 604 is correspondingly reduced by delta (Δ), i.e., T/2−2Δ. By adjusting both the high side and low side PWM signals (B and D) 602 and 604, the PWM signals are scaled and the frame boundary problem is eliminated for phase shifts of ±T/4. Alternatively, both signals could be halved to have nominal widths of approximately T/4±Δ/2 and then selectively phase shifted by ±T/4.

In the timing diagram 600, the high-side PWM signal (B) 602 is reduced by delta (Δ), so that a quarter-frame shift (±T/4) of the PWM signal (B) 602 as illustrated by the shifted BLR signal 606 and the shifted PWM BRL signal 610 does not cause the pulse edge to cross a PWM frame boundary. Correspondingly, the shifted PWM DLR signal 608 and the shifted PWM DRL signal 612 are reduced to a width that is less than half of the frame width ((T/2)−2*Δ). For carrier suppression, the PWMB and PWMD signals 602 and 604 are shifted left and right (as in the "LR" case illustrated by PWM BLR and PWM DLR signals 606 and 608) over a two frame interval or are shifted right and left as in the "RL" case illustrated by PWM BRL and PWM DRL signals 610 and 612) over the two frame interval.

Basic Fourier Transform analysis shows that applying an alternating quarter-frame phase shift repetitively to both the D and the B pulses, the frequency component of the shifted PWM B and D signals (represented at 606, 608, 610, and 612) at the frame repetition rate of 1/T is suppressed, without changing the differential carrier frequency or the frame repetition rate and without substantially impacting the differential signal component. In another particular example in which the quarter-frame phase shifts are applied randomly, the carrier power of the PWM signal is spread, whitening the output power spectrum and its peak common mode power is significantly reduced without substantially altering the differential mode characteristic of the PWM signal.

In this example, while frame boundary issues are eliminated and the carrier at the frame rate is suppressed, the overall dynamic range of the system may also be reduced. In a particular example, since the signal content is contained only in the shifted PWMD signals 608 or 612, the dynamic range of the system may be reduced by 6 dB. In some instances, the dynamic range loss may be acceptable. In other instances, the dynamic range loss may manifest in an undesired reduction in power output. In a particular example, where the output is coupled to a speaker, the dynamic range loss may be seen as a 4× reduction in power output, which may be undesirable, depending on the particular implementation and the desired performance requirements.

2. Quarter Frame Asymmetrical Pulse Shifting with No Wrap-Around

To avoid loss of dynamic range, such as the example of a 6 dB loss, the pulses can be shifted early (left) and late (right) less than a quarter of the frame width (i.e., less than ±T/4). In a particular example, for pulses wider than T/2, the PWM pulses can be shifted from a center-frame temporal location (T/2) by a quarter-frame (±T/4) shift, stopping when the pulse reaches the frame boundary. In this instance, the quarter-frame shift is reduced so that the wide PWM pulse does not cross over the PWM frame boundary, resulting in an asymmetrical phase shift.

Figure 7:
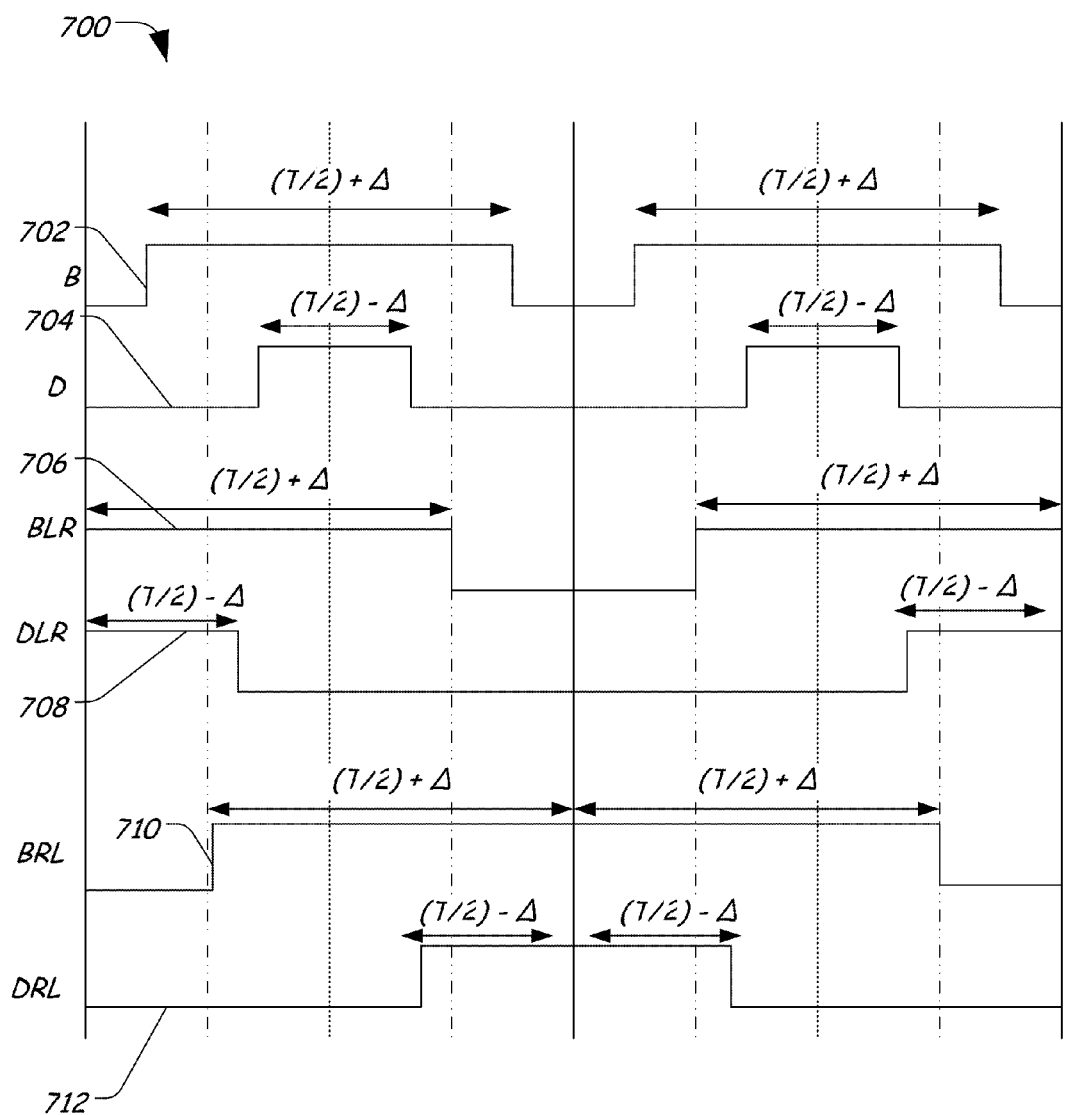
FIG. 7 is a graph of a particular illustrative embodiment of a timing diagram illustrating a quarter-frame asymmetrical phase shift of BD-D PWM signals to suppress a common mode carrier at the frame rate.

FIG. 7 is a graph of a particular illustrative embodiment of a timing diagram 700 illustrating a quarter frame asymmetrical phase shift of complementary PWM signals to suppress a common mode carrier at the frame rate. As used herein, the term "complementary PWM signals" relates to the duty cycle of the two signals, such that a first signal has a first duty cycle and the second signal has a second duty cycle that nominally corresponds to the frame width minus the first duty cycle (i.e., 100%−first_duty_cycle) within limits of time quantization effects. The timing diagram 700 illustrates a high side PWM signal (B) 702 and a low-side PWM signal (D) 704 in sequential frames. The PWM signals (B and D) 702 and 704 are shifted left and then right as illustrated by PWM BLR 706 and PWM DLR 708. Further, the PWM signals (B and D) 702 and 704 are shifted right and then left as illustrated by PWM BRL 710 and PWM DRL 712.

In this particular example, the high side PWM signal (B) 702 has a width that is greater than half of the frame width (T). Specifically, the width of the high side PWM signal (B) 702 is approximately $T/2+\Delta$. Further, the low-side PWM signal (D) 704 has a corresponding width that is less than half of the frame width (T), i.e., $T/2-\Delta$.

In this particular example, to avoid the aforementioned 6 dB loss in dynamic range, the high side PWMB signal 702 may be shifted early (left) or late (right) by a phase that is less than a quarter of the frame, i.e., less than $\pm T/4$, so that the PWM B signal 702 abuts but does not cross the frame boundary. In this example, a full quarter-frame ($\pm T/4$) phase shift is not achieved for the high side PWM B signal 702, as illustrated by PWM BLR signal 706 and PWM BRL signal 710, and complete suppression of the carrier for the PWM B signal 702 is not achieved. To compensate, the PWMD signal 704, which is narrower than T/2, can be phase shifted by more than a quarter of the frame width (i.e., by greater than $\pm T/4$). For example, the PWMD signal 704 can be offset from the quarter frame ($\pm T/4$) location by half of delta ($\pm\Delta/2$), which causes the PWMD signal 704 to also abut the PWM frame boundary (as illustrated by PWM DLR and DRL 708 and 712) in the same way that the wider pulse does. In this instance, the sum of the PWMB and PWMD signals 706 and 708 or 710 and 712 over two frames has zero content at the frame repetition rate in the Fourier Transform; thus canceling the carrier in the common mode signal.

It should be noted that for conventional BD-D PWM modulation, the offset from $\pm T/4$ by $\Delta/2$ causes the narrower pulse 704 to also abut to the frame boundary (as illustrated at 708) in the same way that the wider pulse does, effectively resulting in the modulation scheme being single-sided when viewed over a single frame. For all signals, the output modulation scheme becomes single-sided even if the input modulation scheme is double-sided. While the pulses have been designed so that the common mode energy (the sum of PWM B and PWM D signals 706 and 708 or 710 and 712) has zero frequency content at the frame rate, the same is not true for the differential mode energy (the difference between PWM B and PWM D signals 706 and 708 or 710 and 712). A consequence of the asymmetry of the phase shifted PWM B and PWM D signals 706, 708, 710, and 712 is that the differential mode signal has a carrier frequency component at the frame rate.

3. Quarter Frame Symmetrical Pulse Shifting with Wrap-Around

Figure 8:
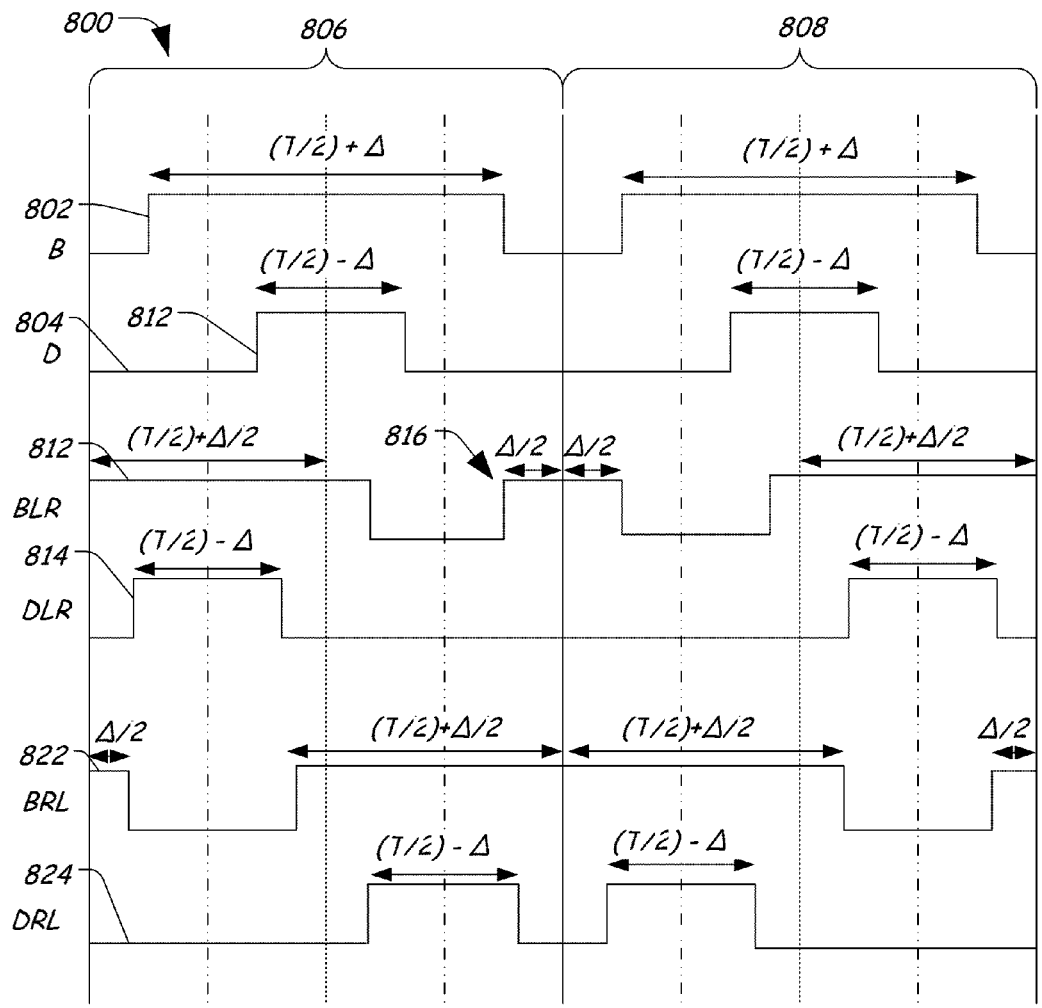
FIG. 8 is a graph of a particular illustrative embodiment of a timing diagram illustrating a quarter-frame symmetrical phase shift of PWM signals with wrap-around of BD-D PWM signals to suppress a common mode carrier at the frame rate.

FIG. 8 is a graph 800 of a particular illustrative embodiment of a timing diagram illustrating a quarter frame-centered symmetrical phase shift of PWM signals with pulse wrap-around to suppress a common mode carrier at the frame rate. In this pulse shifting technique, an original pulse-width modulated (PWM) B pulse 802 and PWMD pulse 804 are shown as centered at T/2 within adjacent PWM frames 806 and 808. In a first example, the graph 800 includes versions of the PWMB and PWMD signals 802 and 804 that are shifted in adjacent frames 806 and 808 with wrap-around, including a left-right (LR) shift, as indicated by the PWM BLR and DLR signals 812 and 814, and a right-left (RL) shift, as indicated by the PWM BRL and DRL signals 822 and 824, respectively. In this example, the PWMB 802 is wider than T/2, so shifting the PWMB 802 by a quarter frame (−T/4) would cause a portion ($\Delta/2$) of the shifted pulse 812 to fall into the previous frame. However, the portion ($\Delta/2$) of the shifted PWMB signal 812 that would have fallen into the previous frame is wrapped to the opposite end (opposing boundary) of the current frame (as indicated at 816). This "wrap-around" technique preserves symmetry and ensures that the shifted PWMB signal 812 (that is shifted left then right or right then left) has no Fourier component at the frame rate, and the PWMD signal 814 also has no signal component at the frame rate. Therefore, the common mode carrier signal (i.e., PWMB plus PWMD) is reduced at the frame rate, and a carrier frequency component is not introduced in the differential signal (PWMB-PWMD) at the frame rate.

In general, when the portion of the PWM signal that crosses the frame boundary approaches zero (i.e., is very narrow), the wrap-around portion of the PWM pulse can become difficult to accurately produce. Poor reproduction of the narrow wrapped pulse can introduce zero crossing distortion. The particular technique used (i.e., quarter-frame symmetrical phase shift with no wrap, quarter-frame asymmetrical phase shift, and quarter-frame symmetrical phase shift with wrap-around) can be dynamically selected based, in part, on the desired output characteristics and on the width of the received complementary PWM pulses.

Figure 9:
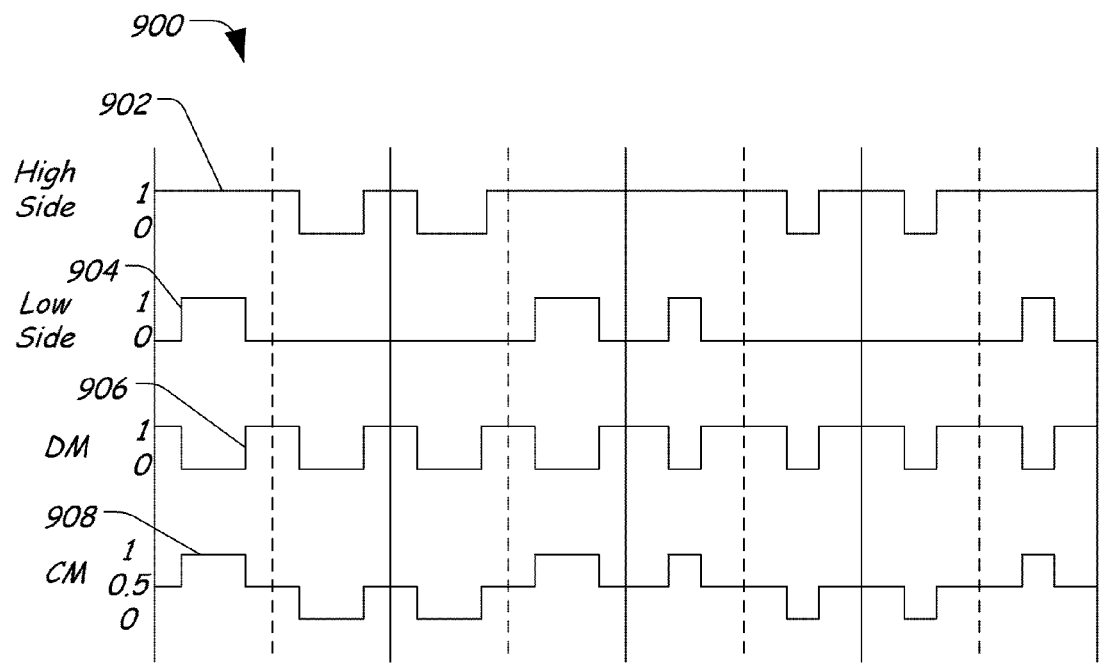
FIG. 9 is a graph of a particular illustrative embodiment of a timing diagram illustrating resulting differential and common mode signals from applying quarter-frame symmetrical phase shifting with wrap-around to BD-D PWM signals to suppress a common mode carrier at the frame rate.

FIG. 9 is a graph of a particular illustrative embodiment of a timing diagram 900 illustrating resulting differential and common mode signals from applying quarter frame symmetrical phase shifting with wrap-around to BD-D PWM signals to suppress a common mode carrier at the frame rate. The timing diagram 900 includes a high side PWM signal 902 and a low side PWM signal 904. Further, the timing diagram 900 includes a differential mode signal 906 and a common mode signal 908. As illustrated by the timing diagram 900, the common mode signal 908 produces no Fourier Transform component at the carrier frequency in adjacent frames.

Figure 10:
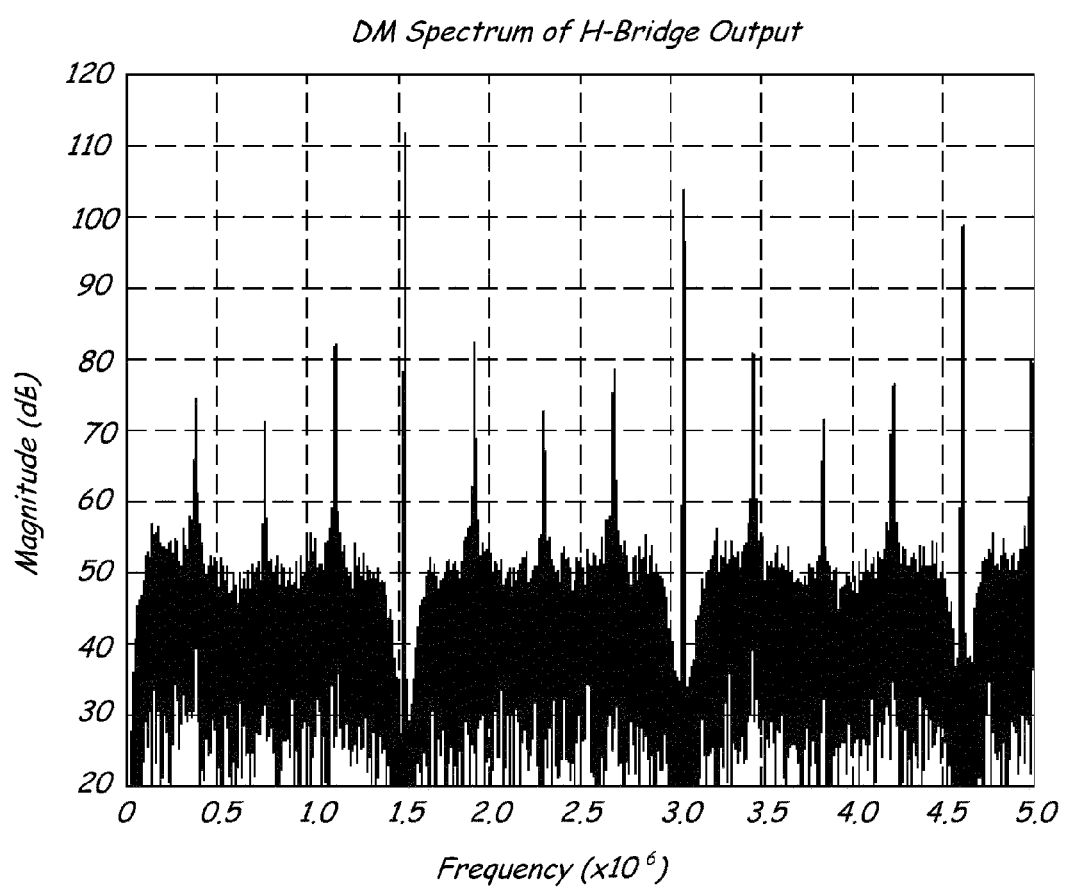
FIG. 10 is a graph of a particular embodiment of a resulting differential mode power spectrum from applying periodic quarter-frame symmetrical phase shifting with wrap-around to BD-D PWM signals, where the frame rate is 768 KHz.

FIG. 10 is a graph of a particular embodiment of a resulting differential mode power spectrum 1000 from applying periodic quarter-frame symmetrical phase shifting with wrap-around to BD-D PWM signals, with alternating phase shifts (+/−T/4 with n=2) and where the frame rate is 768 KHz. As compared to the differential mode power spectrum illustrated in FIG. 3, the differential mode power spectrum 1000 is substantially unchanged.

Figure 11:
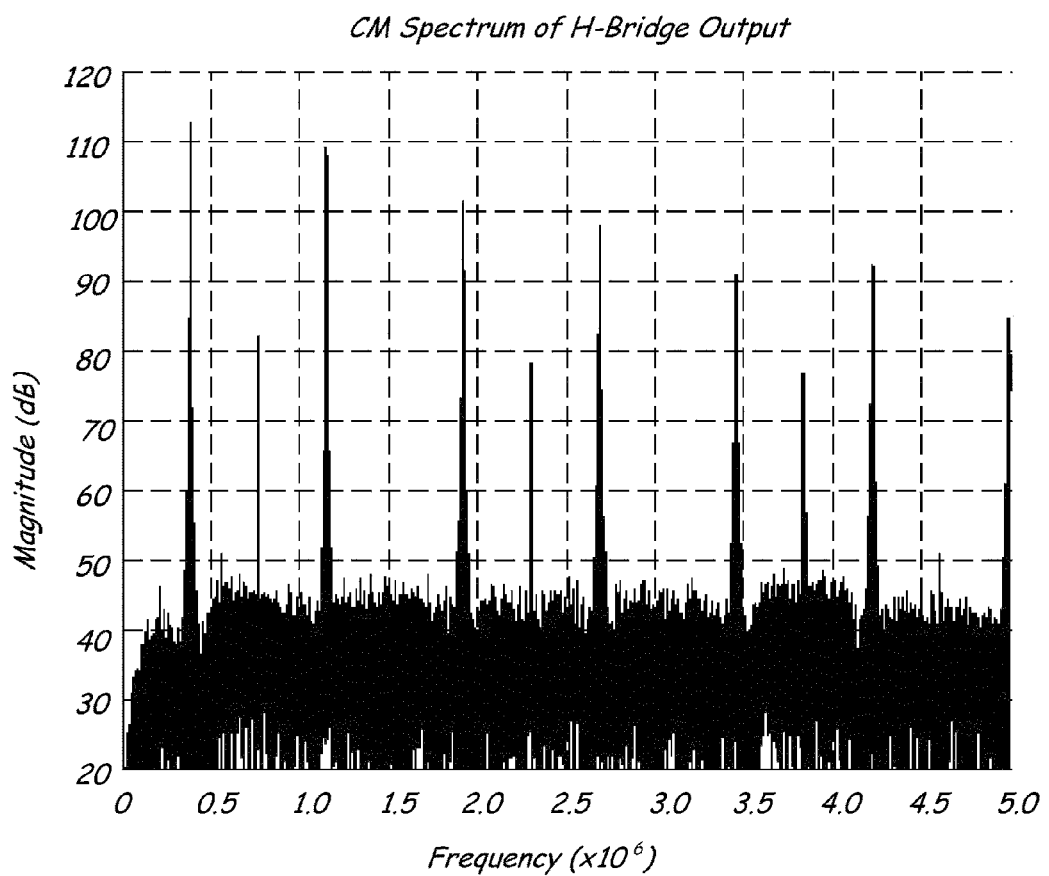
FIG. 11 is a graph of a particular illustrative embodiment of a resulting common mode power spectrum from applying periodic quarter-frame symmetrical phase shifting with wrap-around to BD-D PWM signals, where the PWM frame rate is 768 KHz.

FIG. 11 is a graph of a particular illustrative embodiment of a resulting common mode power spectrum 1100 from applying periodic quarter-frame symmetrical phase shifting with wrap-around to BD-D PWM signals, with alternating phase sifts (+/−T/4 with n=2) and where the PWM frame rate is 768 KHz. As compared to the common mode power spectrum illustrated in FIG. 4, the carrier component at the frame rate is suppressed in the common mode spectrum 1100.

In general, the pulse edge control circuit is adapted to apply the phase shift operation according to a selected superframe pattern, either periodically or randomly, to shape the output power spectrum of the PWM signal. The superframe is a pattern of quarter-frame ($\pm T/4$) left (early) shifts, right (late) shifts, or any combination thereof. In a particular embodiment, construction of particular shifting patterns for periodic or random application can shape the whitened power spectrum and can introduce notches at particular frequencies within the modulated PWM output signal.

Figure 12:
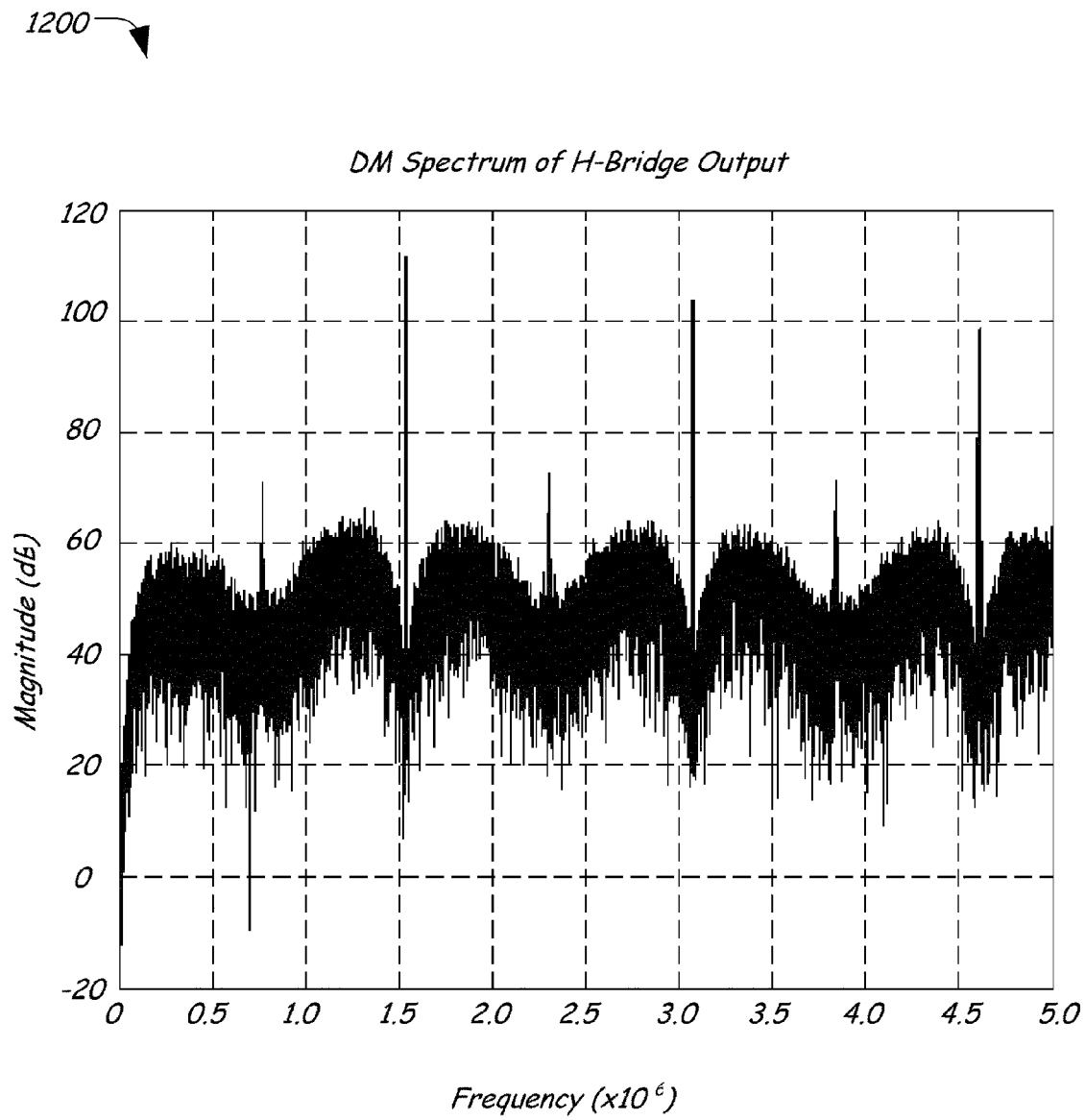
FIG. 12 is a graph of a particular illustrative embodiment of a resulting differential mode power spectrum from applying quarter-frame symmetrical phase shifting with wrap-around to BD-D PWM signals and random superframe selection at a superframe rate, where the frame rate is 768 KHz.

FIG. 12 is a graph of a particular illustrative embodiment of a resulting differential mode power spectrum 1200 from applying quarter frame symmetrical phase shifting with wrap-around to BD-D PWM signals and random superframe selection at the superframe rate, where the frame rate is 768 KHz and the selected superframe is one of two patterns, Left-Right shift sequence or Right-Left shift sequence. As compared to the differential mode power spectrum illustrated in FIG. 3, the differential mode power spectrum 1200 is substantially unchanged.

Figure 13:
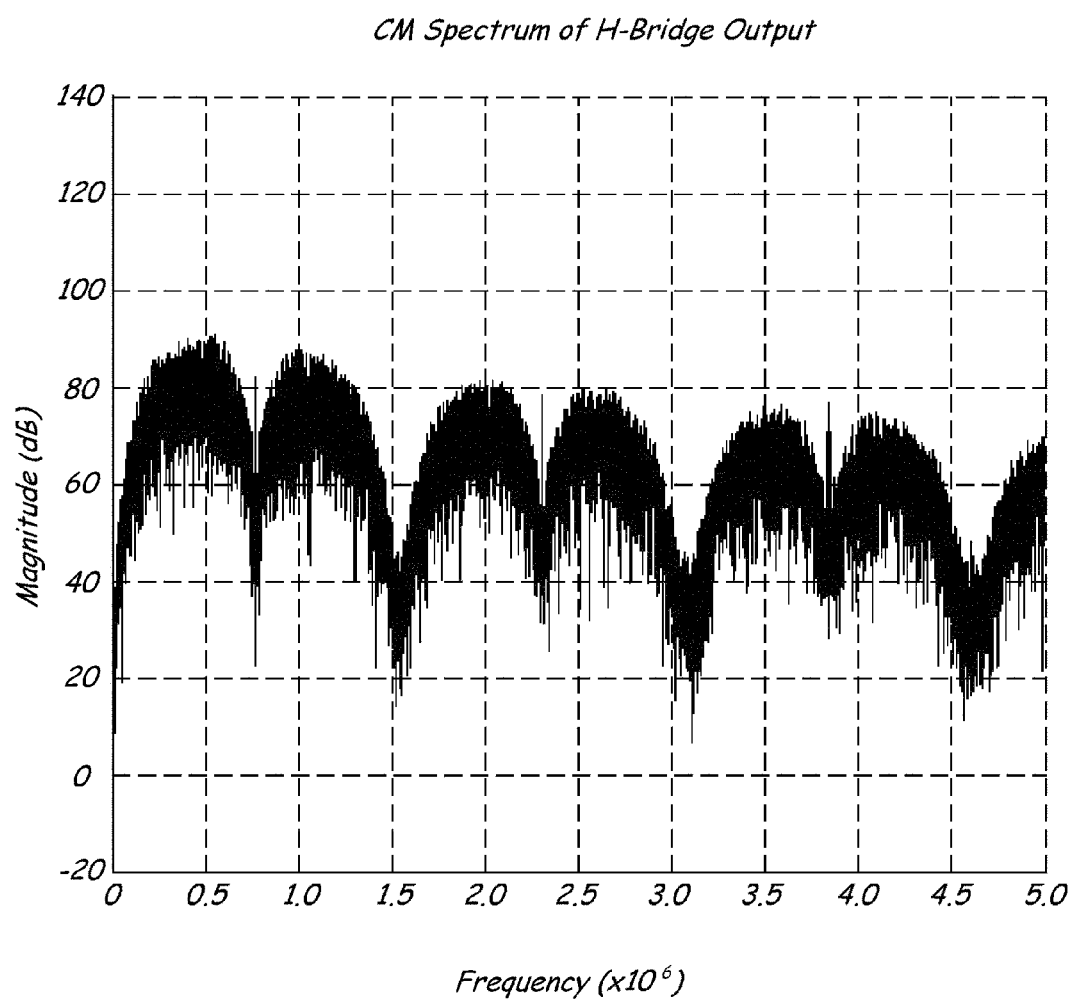
FIG. 13 is a graph of a particular illustrative embodiment of a resulting common mode power spectrum from applying quarter-frame symmetrical phase shifting with wrap-around to BD-D PWM signals using random superframe selection at a superframe rate, where the PWM frame rate is 768 KHz.

FIG. 13 is a graph of a particular illustrative embodiment of a resulting common mode power spectrum 1300 from applying quarter frame symmetrical phase shift with wrap-around to BD-D PWM signals using random superframe selection at the superframe rate, where the frame rate is 768 kHz. In this example, the carrier component at the frame rate is suppressed in the common mode spectrum 1300.

In general, as compared to a conventional common mode carrier power level for BD-D PWM illustrated in FIG. 4, the common-mode power spectrum graph in FIG. 13 demonstrates that the peak common mode carrier power in the AM band is reduced by approximately 20-25 dB. Further, the common mode carrier at 768 kHz has been almost completely eliminated, and the power spectrum around at the carrier harmonic frequencies, such as 384 kHz and 1152 kHz has increased. This spectral shaping occurs because the superframe is now twice the frame size in duration or equivalently has a fundamental frequency of 384 kHz. By balancing the left and right shifts over a sequence of frames, the even harmonics at the frame rate are eliminated, but the odd harmonics remain. If a superframe were used that provided a periodic shifting pattern, such as an alternating pattern, rather than random, distinct tones can be created at 384 kHz and 1152 kHz, as seen in FIG. 11. The randomization effectively spreads such tones, whitening the output power spectrum.

Figure 14:
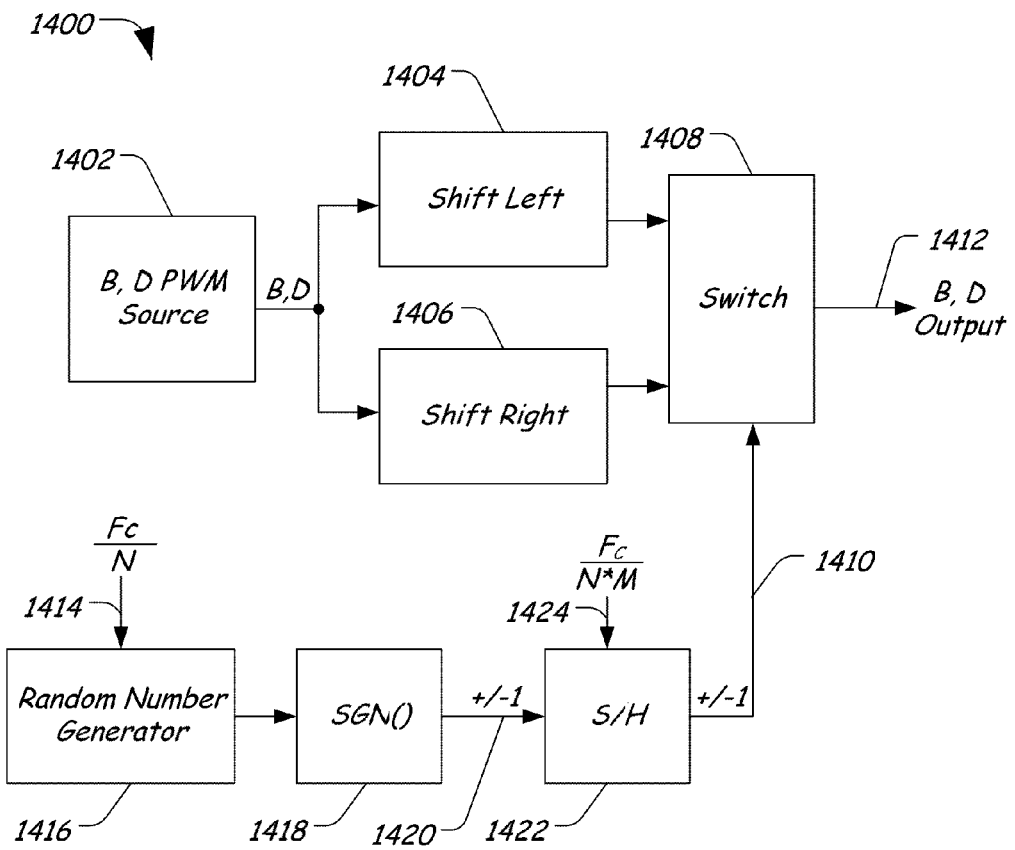
FIG. 14 is a block diagram of a second particular illustrative embodiment of a system adapted to apply the phase shift operation according to a selected superframe pattern to suppress a pulse-width modulation (PWM) carrier.

FIG. 14 is a block diagram of a second particular illustrative embodiment of a system to suppress a pulse-width modulation (PWM) carrier. The system 1400 includes a B and D pulse width modulation (PWM) signal source 1402 that provides a PWMB and PWMD signals to a shift (rotate) left structure 1404 and to a complementary shift (rotate) right structure 1406, respectively. In this example, the shift left structure 1404 and the complementary shift right structure 1406 can be configured to shift the PWMB and PWMD signals left (−T/4) and right (+T/4), respectively. The system 1400 further includes a switch 1408 to receive outputs of the left structure 1404 and the complementary shift right structure 1406 and to selectively output at least one of the left-shifted or right-shifted outputs as a BD-D PWM output signal at the output 1412, which may be provided to a circuit component, such as the first and second gate drivers 130 and 132 illustrated in FIG. 1.

The system 1400 includes a random number generator 1416 that receives data related to carrier frequency (Fc) 1414 and a superframe length (N) and outputs a random number. In this particular instance, a superframe length (N) represents a pattern for the switch to select between the left-shifted or right-shifted signals from the left structure 1404 and the complementary shift right structure 1406.

In a particular embodiment, the random number generator 1416 can be any zero mean source number generator, preferably with a white spectrum. In another particular embodiment, the random number generator 1416 can include a pseudo-random binary sequence generator. In yet another embodiment, the random number generator 1416 can be a zero mean source with a colored spectrum. The random number output is provided to a sign generator (SGN( )) 1418, which produces a binary output signal that varies between plus or minus one (±1). The signal from the sign generator 1418 is provided to a superframe sample and hold logic (S/H) 1422 that uses the carrier frequency (Fc), the superframe length (N), and a multiplier (M) as an input 1424 to cause a pattern to repeat at a selectable rate and to produce a superframe switching pattern 1410 that controls the switch 1408. In a particular example, the multiplier (M) can be used to adjust the sample and hold rate to be a sub-multiple of the carrier frequency (Fc). Lowering a sample rate can place notches closer together in frequency within the modulated PWM output spectrum.

In general, the sample and hold logic 1422 can periodically or randomly cause a superframe pattern to repeat at the superframe rate or at a lower rate. Similarly, random switching can be at the superframe rate or at a sub-multiple of the frame rate. Additionally, the spectrum of the random switching can be colored by means known in the art (such as Sigma-Delta modulation), to suppress random noise components at selected frequencies, such as within the AM radio frequency band.

In a particular embodiment, a simple and effective randomization process randomly selects the "LR" or "RL" superframe, at the superframe rate. The effect of this random selection of the superframe places a frequency notch at the carrier frequency in the common mode. In a particular example, the notch is placed at 768 kHz, which falls within the AM radio frequency band at the carrier frequency of the complementary PWM signals.

Figure 15:
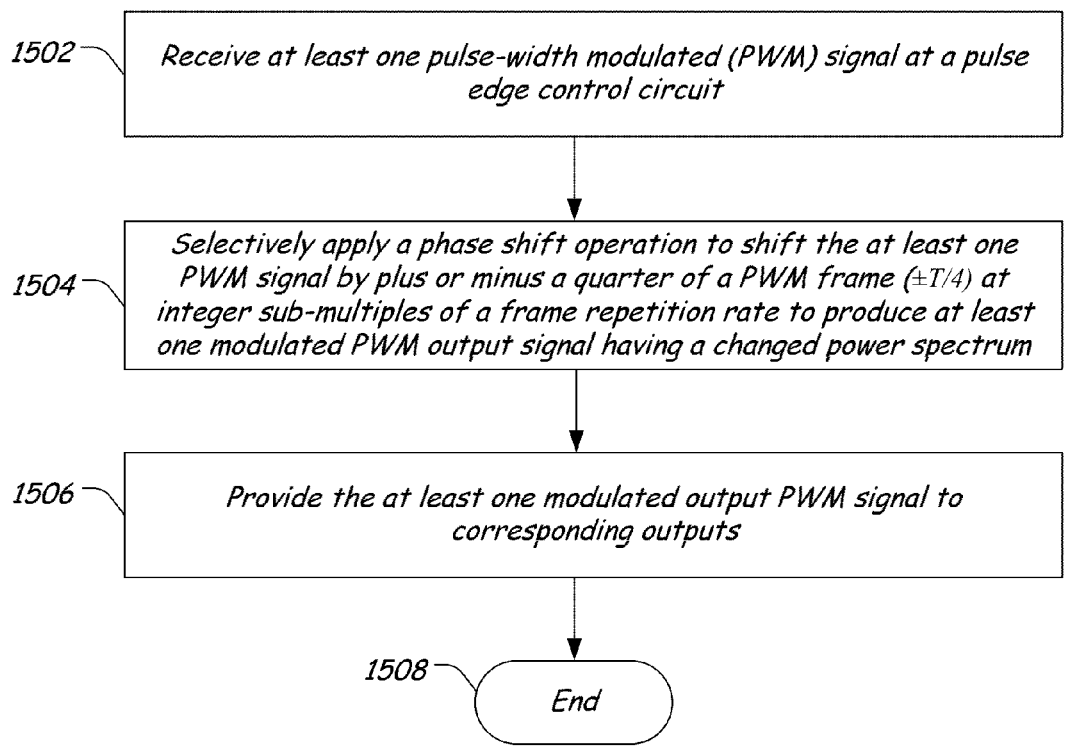
FIG. 15 is a flow diagram of a particular illustrative embodiment of a method of changing a pulse-width modulation (PWM) power spectrum by selectively phase shifting an at least one PWM input signal by +/−T/4.

FIG. 15 is a flow diagram of a particular illustrative embodiment of a method of changing a pulse-width modulation (PWM) power spectrum. At 1502, at least one pulse-width modulated (PWM) signal is received at a pulse edge control circuit. Advancing to 1504, a phase shift operation is selectively applied to shift the at least one PWM signal by plus or minus a quarter of a PWM frame width (±T/4) at integer submultiples of a frame repetition rate to produce at least one modulated PWM signal having a changed power spectrum. In a particular embodiment, selectively applying the phase shift operation includes randomly or periodically phase shifting the at least one PWM signal by either plus or minus a quarter of the PWM frame width (i.e., ±T/4). The resulting at least one modulated PWM signal has a suppressed carrier in a common mode power spectrum.

Continuing to 1506, the at least one modulated PWM output signal is provided to a corresponding at least one output. The at least one modulated PWM signal has reduced electromagnetic interference (EMI) and radio frequency (RF) interference at particular frequencies relative to the received at least one PWM signal. The method terminates at 1508.

In a particular embodiment, the method also includes receiving a control signal at the pulse edge control circuit and adjusting the integer sub-multiple of the frame repetition rate in response to receiving the control signal to shape a power spectrum of the at least one modulated PWM signal.

Figure 16:
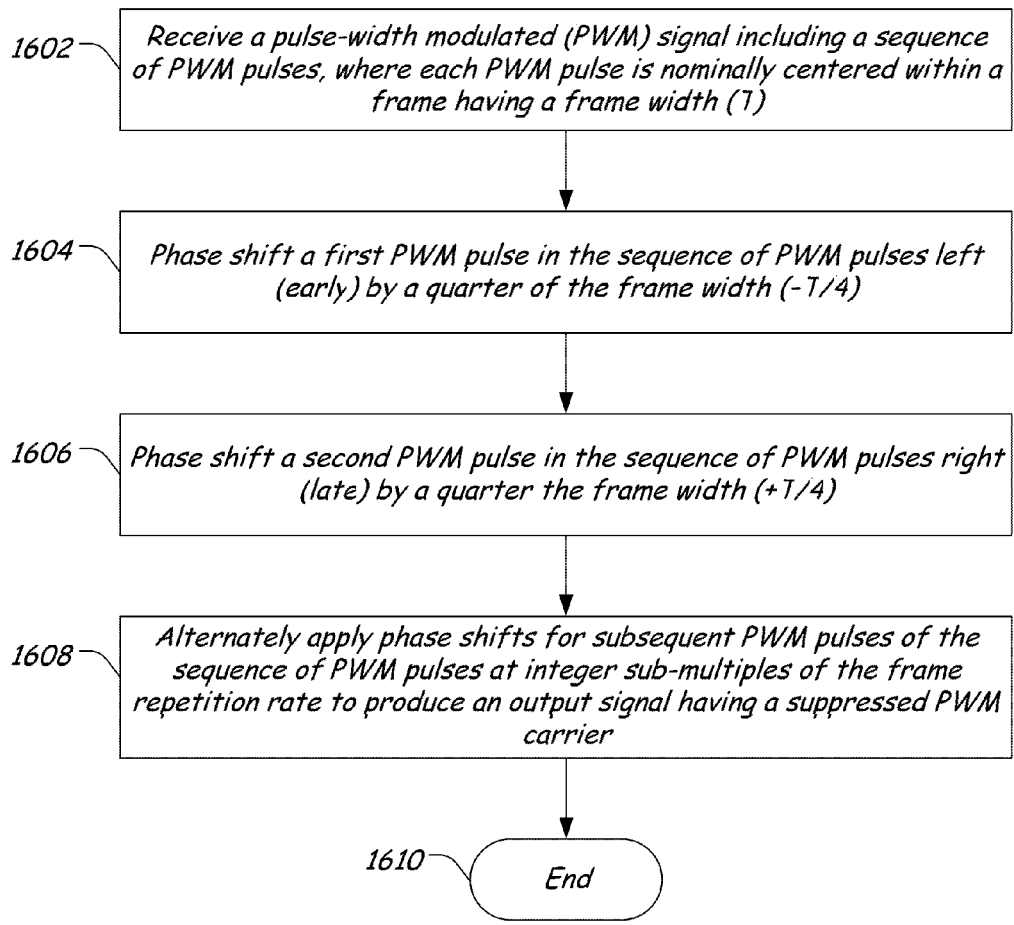
FIG. 16 is a flow diagram of a particular illustrative embodiment of a method of changing a pulse-width modulation (PWM) power spectrum using alternating quarter-frame symmetrical phase shifting applied to a single ended PWM signal.

FIG. 16 is a flow diagram of a particular illustrative embodiment of a method of changing a pulse-width modulation (PWM) power spectrum using alternating quarter-frame symmetrical phase shifting applied to a single ended PWM signal. At 1602, a pulse-width modulated (PWM) signal is received that includes a sequence of PWM pulses, where each PWM pulse is nominally centered within a frame having a frame width (T). Advancing to 1604, a first PWM pulse of the sequence of PWM pulses is phase shifted left (early) by a quarter of the frame width (−T/4). In a particular example, a first set of PWM pulses from the sequence of PWM pulses is shifted left, where the number of PWM pulses in the first set of PWM pulses corresponds to an integer multiple of the frame width. Moving to 1606, a second PWM pulse of the sequence of PWM pulses is phase shifted right (late) by a quarter of the frame width (+T/4). Proceeding to 1608, subsequent PWM pulses (or sets of PWM pulses) from the sequence of PWM pulses are alternately phase shifted by plus or minus a quarter of the frame width (i.e., ±T/4) at integer submultiples of the frame repetition rate to produce an output signal having a suppressed PWM carrier. The method terminates at 1610.

Figure 17:
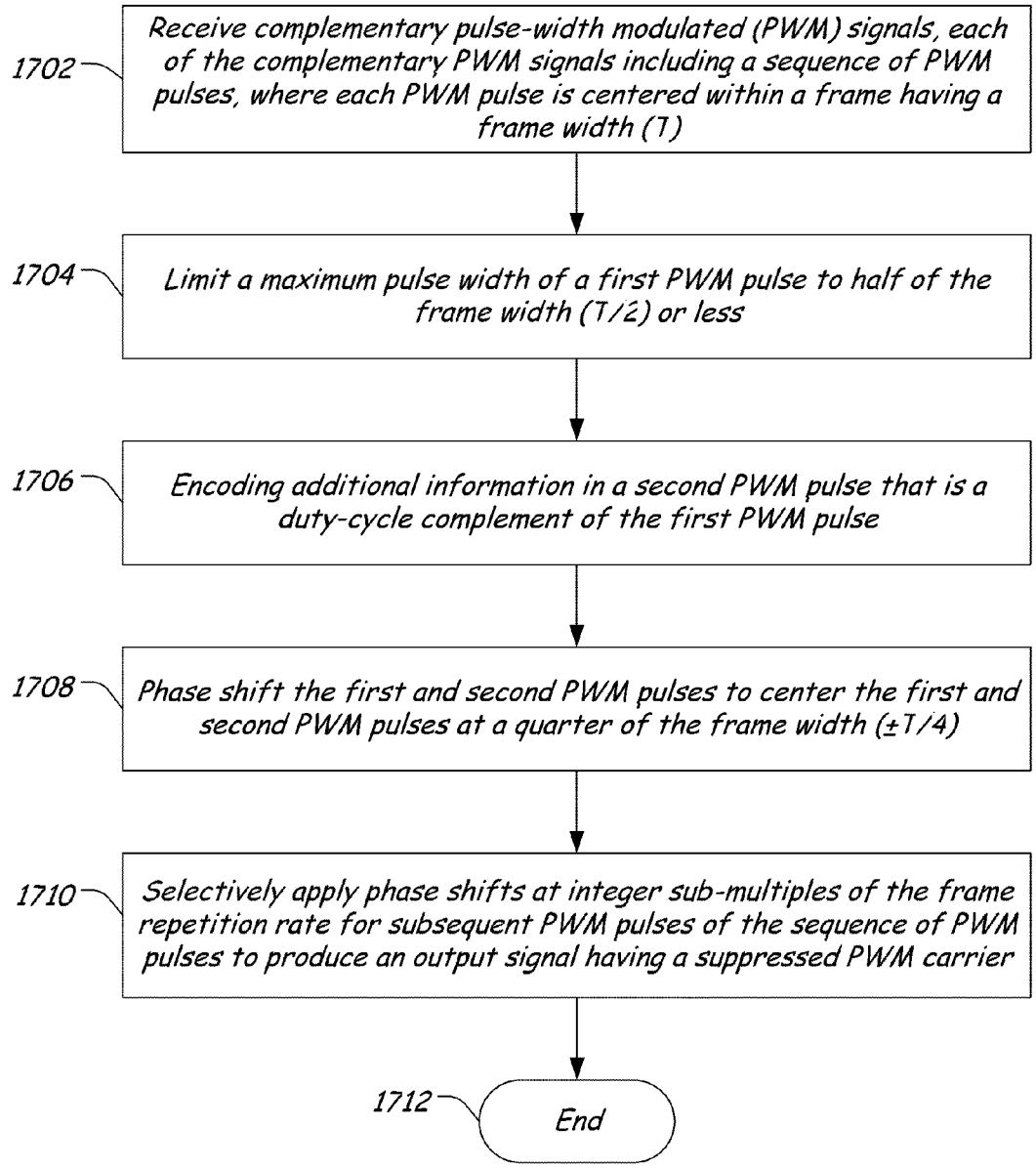
FIG. 17 is a flow diagram of a particular illustrative embodiment of a method of changing a pulse-width modulation (PWM) power spectrum using selective quarter-frame symmetrical phase shifting with limited maximum modulation applied to complementary PWM signals.

FIG. 17 is a flow diagram of a particular illustrative embodiment of a method of changing a pulse-width modulation (PWM) power spectrum using selective quarter-frame symmetrical phase shifting with limited maximum modulation applied to complementary PWM signals. At 1702, complementary pulse-width modulated (PWM) signals are received, where each of the complementary PWM signals includes a sequence of PWM pulses and where each PWM pulse is nominally centered within a frame having a frame width (T). Advancing to 1704, a maximum pulse width of a first PWM pulse is limited to half of the frame width (T/2) or less. Advancing to 1706, additional information is encoded in a second PWM pulse that is a duty-cycle complement of the first PWM pulse. Continuing to 1708, the first and second PWM pulses are phase shifted to center the first and second PWM pulses at a quarter of the frame width (±T/4). Advancing to 1710, subsequent PWM pulses of the sequence of PWM pulses are selectively phase shifted at integer submultiples of the frame repetition rate to produce an output signal having a suppressed PWM carrier. The method terminates at 1712.

Figure 18:
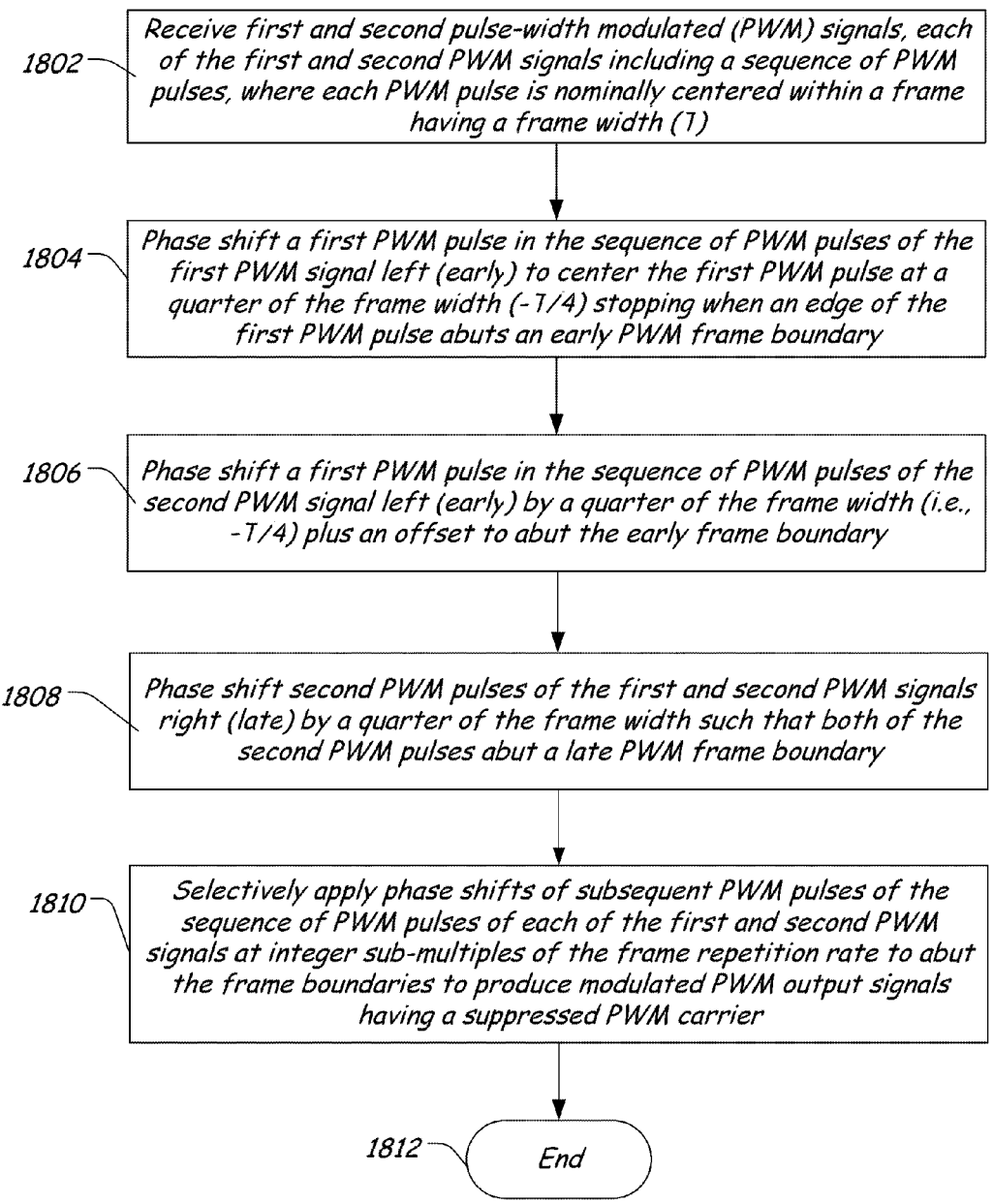
FIG. 18 is a flow diagram of a particular illustrative embodiment of a method of changing a pulse-width modulation (PWM) power spectrum using alternating asymmetrical quarter-frame phase shifting with abutment applied to a pair of PWM signals.

FIG. 18 is a flow diagram of a particular illustrative embodiment of a method of changing a pulse-width modulation (PWM) power spectrum using alternating asymmetrical quarter-frame phase shifting with abutment applied to a pair of PWM signals. At 1802, first and second pulse-width modulated (PWM) signals are received, which signals include sequences of PWM pulses, where each PWM pulse is nominally centered within a frame having a frame width (T). Advancing to 1804, a first PWM pulse in the sequence of PWM pulses of the first PWM signal is phase shifted left (early) to center the first PWM pulse at a quarter of the frame width (−T/4) stopping when an edge of the first PWM pulse abuts an early PWM frame boundary. Continuing to 1806, a first PWM pulse in the sequence of PWM pulses of the second PWM signal is phase shifted left (early) by a quarter of the frame width (−T/4) plus an offset (−Δ) to abut the early frame boundary.

Proceeding to 1808, second PWM pulses of the first and second PWM signals are phase shifted right (late) by a quarter of the frame width (+T/4) plus an offset (Δ) such that both of the second PWM pulses abut a late PWM frame boundary. Moving to 1810, subsequent PWM pulses of the sequence of PWM pulses for each of the first and second PWM signals are selectively phase shifted at integer sub-multiples of the frame repetition rate to about the frame boundaries to produce PWM output signals having a suppressed common mode carrier. The method terminates at 1812.

Figure 19:
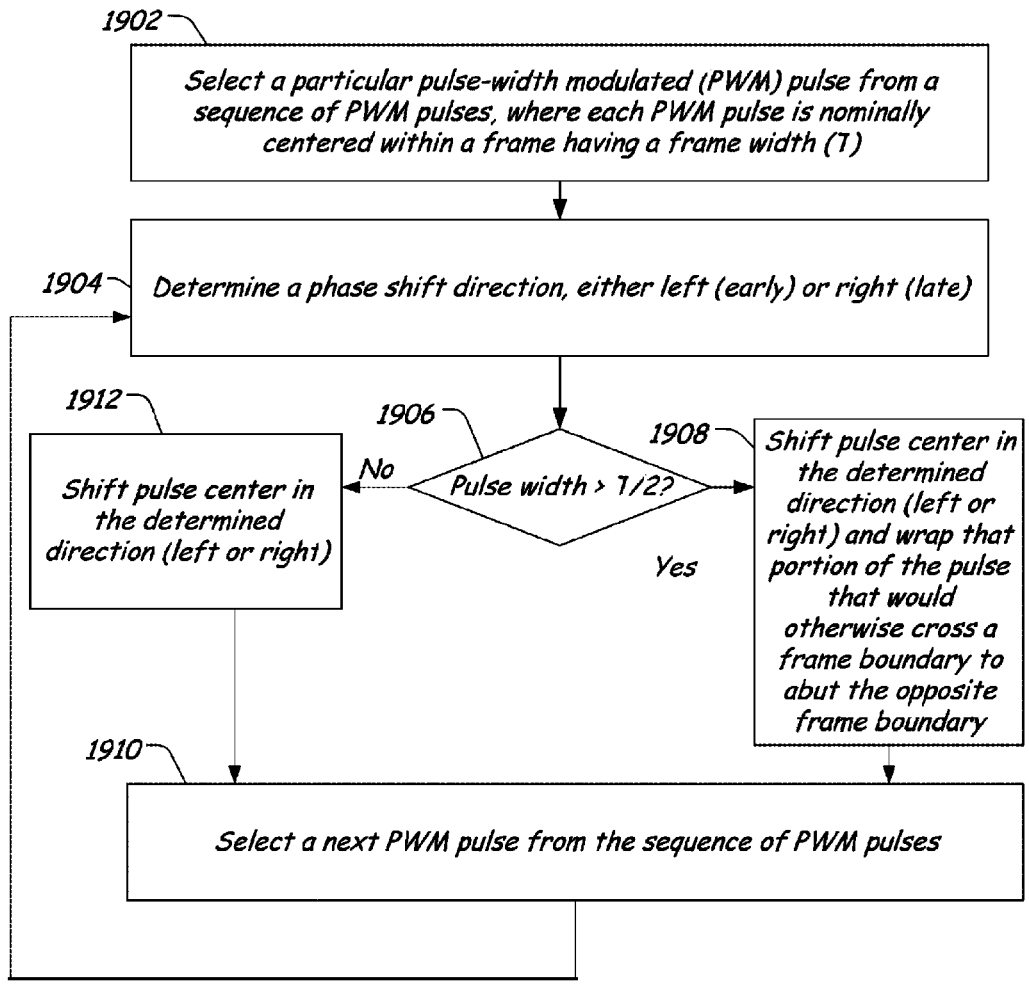
FIG. 19 is a flow diagram of a particular illustrative embodiment of a method of changing a pulse-width modulation (PWM) power spectrum using selective symmetrical quarter-frame phase shifting with wrap-around to a single-ended PWM signal.

FIG. 19 is a flow diagram of a particular illustrative embodiment of a method of changing a pulse-width modulation (PWM) power spectrum using selective symmetrical quarter-frame phase shifting with wrap-around to a single-ended PWM signal. At 1902, a particular pulse-width modulated (PWM) pulse is selected from a sequence of PWM pulses, where each PWM pulse is nominally centered within a frame having a frame width (T). Advancing to 1904, a phase shift direction is determined, either left (early) or right (late).

Continuing to 1906, if a width of the PWM pulse is greater than half of the frame width (T/2), the method advances to 1908 and a pulse center of the PWM pulse is shifted in the determined direction (left or right) and that portion of the pulse that would otherwise cross a frame boundary is wrapped to abut the opposite frame boundary. Continuing to 1910, a next PWM pulse is selected from the sequence of PWM pulses. Returning to 1904, a phase shift direction is determined for the next PWM pulse, either left (early) or right (late), and the method continues.

Returning to 1906, if the width of the PWM pulse is not greater than half of the frame width (T/2), the method proceeds to 1912 and a pulse center of the PWM pulse is shifted in the determined direction (left or right). Continuing to 1910, a next PWM pulse is selected from the sequence of PWM pulses. Returning to 1904, a phase shift direction is determined for the next PWM pulse, either left (early) or right (late), and the method continues.

In conjunction with the systems and methods disclosed above, a phase shift operation is selectively applied to one or more pulse-width modulated (PWM) signals to produce a modulated PWM output having an altered power characteristic, such as suppressed carrier energy, an altered power spectrum, or any combination thereof. In general, the phase shift operation is selectively applied to the PWM signal to phase shift or rotate PWM pulses of the PWM signal. The phase shift operation can include a center frame symmetrical phase shift operation, a quarter frame symmetrical phase shift operation with no wrap-around, an asymmetrical phase shift operation, or a symmetrical phase shift operation with wrap-around.

In a particular embodiment, if two or more PWM signals having the same frame repetition rate are phased shifted according to the same phase shift operation to produce modulated PWM output signals, the modulated PWM output signals have suppressed power spectrum and/or a suppressed carrier, which suppression is correlated. In another particular embodiment, if complementary PWM signals are phased shifted according to the same phase shift operation, a modulated PWM output signal is produced that has a suppressed peak common mode power at the carrier frequency without altering the carrier frequency and without altering a frame repetition rate.

Further, by selectively applying a phase shift operation periodically or randomly, the output power spectrum of the modulated PWM output signal can be changed. Periodic phase shifting can suppress a carrier and move tones to frequencies other than the carrier frequency within the modulated PWM output signal. Random phase shifting can spread and whiten the power spectrum of the modulated PWM output signal. Construction of superframe patterns that specify a phase shifting pattern (such as early, late, early, early . . . ) and either periodic or random switching of superframe patterns can further shape ("whiten") the power spectrum and introduce notches at particular frequencies within the modulated PWM output signal.

Although the present invention has been described with reference to preferred embodiments, workers skilled in the art will recognize that changes may be made in form and detail without departing from the spirit and scope of the invention.

What is claimed is:
1. A circuit comprising:
   at least one input adapted to receive at least one pulse-width modulated (PWM) signal;
   at least one output for providing at least one modulated PWM signal; and a pulse edge control circuit coupled to the at least one input and to the at least one output, the pulse edge control circuit adapted to selectively phase shift the at least one PWM signal to produce the at least one modulated PWM signal having a changed power spectrum.

2. The circuit of claim 1, wherein the pulse edge control circuit comprises:
a control input coupled to the pulse edge control circuit and adapted to receive a control signal; and
wherein the pulse edge control circuit selectively phase shifts the at least one PWM signal within each sequential frame to selectively adjust a shape of the changed power spectrum in response to receiving the control signal.

3. The circuit of claim 1, wherein the pulse edge control circuit produces the at least one modulated PWM signal without changing an effective duty cycle associated with the at least one PWM signal from frame to frame.

4. The circuit of claim 1, wherein the pulse edge control circuit selectively phase shifts the at least one PWM signal within a PWM frame by a fraction of a width of the PWM frame over a sequence of PWM frames.

5. The circuit of claim 1, wherein the pulse edge control circuit is adapted to selectively phase shift the at least one PWM signal to align an edge transition of the at least one PWM signal to a boundary of a PWM frame.

6. The circuit of claim 1, wherein the pulse edge control circuit is adapted to selectively phase shift the at least one PWM signal within a PWM frame by a phase interval corresponding to one of one quarter of a frame width of the PWM frame, one half of the frame width, and three-quarters of the frame width.

7. The circuit of claim 1, wherein the pulse edge control circuit is adapted to selectively phase shift the at least one PWM signal according to a constructed pattern to concentrate a carrier signal energy at frequencies other than a carrier frequency of the at least one modulated PWM signal.

8. The circuit of claim 1, wherein the at least one PWM signal includes a first PWM signal and a second PWM signal;
wherein the first and second PWM signals form a differentially encoded signal pair; and
wherein the pulse edge control circuit is configured to selectively phase shift the first and second PWM signal by a predetermined phase to produce the at least one modulated PWM signal including a first modulated PWM signal and a second modulated PWM signal.

9. The circuit of claim 1, wherein the pulse edge control circuit is adapted to selectively phase shift the at least one PWM signal according to a random pattern to whiten a power spectrum of the at least one modulated PWM signal to produce the changed power spectrum.

10. A system comprising:
a first input terminal adapted to receive a first pulse width modulated (PWM) signal;
a second input terminal adapted to receive a second PWM signal;
a first output terminal for providing a first modulated PWM signal;
a second output terminal for providing a second modulated PWM signal; and
a pulse edge control circuit coupled to the first and second input terminals and to the first and second output terminals, the pulse edge control circuit adapted to selectively apply a phase shift operation to the first and second PWM signals to produce the first and second modulated PWM signals.

11. The system of claim 10, further comprising:
a first timing control circuit including an input coupled to the first output terminal and including an output;
a second timing control circuit including an input coupled to the second output terminal and including an output;
a first gate driver including an input coupled to the output of the first timing control circuit and a driver output coupled to a first input of an H-bridge circuit; and
a second gate driver including an input coupled to the output of the second timing control circuit and a driver output coupled to a second input of the H-bridge circuit.

12. The system of claim 11, further comprising the H-bridge circuit including:
the first input;
the second input;
a first H-bridge output for providing the first modulated PWM signal; and
a second H-bridge output for providing the second modulated PWM signal.

13. The system of claim 12, wherein the first and second H-bridge outputs are configurable to be coupled to a speaker to provide the first and second modulated PWM signals for an audio application.

14. The system of claim 12, wherein the first and second H-bridge outputs are configurable to be coupled to a switched power circuit to provide the first and second modulated PWM signals for a power control application.

15. The system of claim 12, wherein the first and second H-bridge outputs are configurable to be coupled to a motor control circuit to provide the first and second modulated PWM signals for a motor control application.

16. The system of claim 12, wherein the first and second modulated PWM signals have reduced electromagnetic interference (EMI) and reduced radio frequency (RF) interference at particular frequencies relative to the first and second PWM signals.

17. The system of claim 10, wherein the pulse edge control circuit produces the first and second modulated PWM signals without changing at least one of a frame repetition rate and a carrier frequency of the first and second PWM signals.

18. The system of claim 10, wherein the pulse edge control circuit selectively applies the phase shift operation to each pulse edge of the first and second PWM signals to produce the first and second modulated PWM signals.

19. The system of claim 10, wherein the pulse edge control circuit selectively applies the phase shift operation to at least two pulse edges of the first and second PWM signals to produce the first and second modulated PWM signals.

20. The system of claim 10, wherein a common mode carrier energy of the first and second modulated PWM signals is suppressed without changing a differential baseband signal associated with the first and second PWM signals.

21. A method comprising:
receiving at least one pulse-width modulated (PWM) signal at a pulse edge control circuit;
selectively phase shifting the at least one PWM signal to produce at least one modulated PWM signal having a changed power spectrum; and
providing the at least one modulated PWM signal to a corresponding at least one output.

22. The method of claim 21, wherein selectively phase shifting the at least one PWM signal comprises selectively applying a phase shift operation to the at least one PWM signal at discrete time intervals; and
wherein each of the discrete time intervals is an integer sub-multiple of a frame repetition rate of the at least one PWM signal.

23. The method of claim 21, wherein selectively phase shifting comprises alternately phase shifting and not phase shifting the at least one PWM signal.

24. The method of claim 23, wherein alternately phase shifting and not phase shifting the at least one PWM signal is performed at periodic intervals to concentrate a carrier signal energy at frequencies other than a carrier frequency within the changed power spectrum.

25. The method of claim 23, wherein alternately phase shifting and not phase shifting the at least one PWM signal is performed at random intervals to whiten carrier signal energy within the changed power spectrum.

26. The method of claim 21, wherein the at least one modulated PWM signal has reduced electromagnetic interference (EMI) and radio frequency (RF) interference at particular frequencies relative to that of the at least one PWM signal.

* * * * *